(12) United States Patent
Segami

(10) Patent No.: US 10,355,703 B2
(45) Date of Patent: Jul. 16, 2019

(54) SYSTEM, ANALOG TO DIGITAL CONVERTER, AND METHOD OF CONTROLLING SYSTEM

(71) Applicant: SONY SEMICONDUCTOR SOLUTIONS CORPORATION, Kanagawa (JP)

(72) Inventor: Masahiro Segami, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/738,779

(22) PCT Filed: Apr. 18, 2016

(86) PCT No.: PCT/JP2016/062244
§ 371 (c)(1),
(2) Date: Dec. 21, 2017

(87) PCT Pub. No.: WO2017/002431
PCT Pub. Date: Jan. 5, 2017

(65) Prior Publication Data
US 2018/0183448 A1 Jun. 28, 2018

(30) Foreign Application Priority Data
Jun. 29, 2015 (JP) .................. 2015-129539

(51) Int. Cl.
*H03M 1/12* (2006.01)
*H03M 1/00* (2006.01)
*H03M 1/46* (2006.01)

(52) U.S. Cl.
CPC ........... *H03M 1/002* (2013.01); *H03M 1/125* (2013.01); *H03M 1/46* (2013.01)

(58) Field of Classification Search
CPC ...... H03M 1/462; H03M 1/468; H03M 1/125; H03M 1/12; H03M 1/1245; H03M 1/002;
(Continued)

(56) References Cited

U.S. PATENT DOCUMENTS 8,456,340 B2 * 6/2013 Kapusta ................ H03M 1/125
341/144
2005/0162301 A1 7/2005 Mizumasa et al.
(Continued)

FOREIGN PATENT DOCUMENTS

CN 1649273 A 8/2005
CN 102197594 A 9/2011
(Continued)

OTHER PUBLICATIONS

Chen, et al., "A 6-Bit 600-MS/s 5.3-mW Asynchronous ADC in 0.13-μm CMOS", IEEE Journal of Solid-State Circuits, vol. 41, No. 12, Dec. 2006, pp. 2669-2680.
(Continued)

*Primary Examiner* — Linh V Nguyen
(74) *Attorney, Agent, or Firm* — Chip Law Group

(57) ABSTRACT

Power consumption of a successive-approximation type analog to digital converter is reduced. A system is provided with an analog to digital converter and a power-supply voltage generation unit. In the system provided with the analog to digital converter and the power-supply voltage generation unit, the analog to digital converter compares an analog signal with a reference signal and outputs frequency information indicating the number of times of comparison. Also, in the system, the power-supply voltage generation unit generates power-supply voltage on the basis of the frequency information output by the analog to digital converter and supplies the same to the analog to digital converter.

19 Claims, 33 Drawing Sheets

(58) Field of Classification Search
CPC .......... H03M 1/38; H03M 1/14; H03M 1/667; H03M 1/001
USPC .......................................... 341/118, 120, 155
See application file for complete search history.

(56) References Cited

U.S. PATENT DOCUMENTS

| | | | |
|---|---|---|---|
| 2009/0021219 A1* | 1/2009 | Yoda | H02J 7/025 |
| | | | 320/137 |
| 2011/0063147 A1 | 3/2011 | Yoshioka | |
| 2011/0204926 A1 | 8/2011 | Inoue | |
| 2012/0032824 A1* | 2/2012 | Yoshioka | H03L 7/0812 |
| | | | 341/110 |
| 2013/0076552 A1* | 3/2013 | Nam | H03M 1/002 |
| | | | 341/164 |
| 2014/0210653 A1* | 7/2014 | Harpe | H03M 1/0697 |
| | | | 341/110 |
| 2015/0061904 A1* | 3/2015 | Lee | H03M 1/1023 |
| | | | 341/118 |
| 2016/0254821 A1* | 9/2016 | Luo | H03M 1/125 |
| | | | 341/161 |
| 2017/0041016 A1* | 2/2017 | Harada | H03M 1/38 |
| 2017/0237268 A1* | 8/2017 | Brannick | H03M 1/52 |
| | | | 378/91 |

FOREIGN PATENT DOCUMENTS

| | | |
|---|---|---|
| EP | 1569344 A1 | 8/2005 |
| JP | 2005-217530 A | 8/2005 |
| JP | 2010-109661 A | 5/2010 |
| JP | 2011-061597 A | 3/2011 |
| JP | 2013-106116 A | 5/2013 |
| WO | 2010/050294 A1 | 5/2010 |

OTHER PUBLICATIONS

International Search Report and Written Opinion of PCT Application No. PCT/JP2016/062244, dated Jul. 5, 2016, 9 ages of ISRWO.

Chen, et al.,"A 6-bit 600MS/s 5.3mW Asynchronous ADC in 0.13-μm CMOS", IEEE Journal of Solid-State Circuits, vol. 41, No. 12, Dec. 2006, 12 pages.

* cited by examiner

FIG. 5

| COMPARATOR CONTROL SIGNAL CMP | INPUT VOLTAGE (SHOUT) | DIFFERENTIAL SIGNAL | |
|---|---|---|---|
| | | CMPP | CMPN |
| 0 | — | HIGH LEVEL | HIGH LEVEL |
| 1 | INPUT VOLTAGE (SHOUT) > REFERENCE VOLTAGE (DAOUT) | HIGH LEVEL | LOW LEVEL |
| | INPUT VOLTAGE ≤ REFERENCE VOLTAGE | LOW LEVEL | HIGH LEVEL |

FIG. 6

| WRITE CONTROL SIGNAL rWRITE | START INSTRUCTION SIGNAL RUN | OPERATION OF REGISTER |
|---|---|---|
| — | 1 | RESET DATA |
| ↑ | 0 | UPDATE BIT OF DIGIT CORRESPONDING TO NSTEP OUT OF DATA BY LATCH OUTPUT SIGNAL SROUT |
| OTHER THAN ↑ | 0 | HOLD STATE |

FIG. 7

| COMPARISON COUNTER VALUE NSTEP | START CONTROL SIGNAL RUN | OPERATION OF CONVERSION TIME MEASUREMENT UNIT |
|---|---|---|
| — | ↓ | START CLOCKING |
| VALUE OTHER THAN 0 | o | CONTINUE CLOCKING |
| 0 | — | END CLOCKING AND OUTPUT CLOCKED TIME AS CONVERSION TIME |
| VALUE OTHER THAN 0 | ↑ | END CLOCKING AND CALCULATE CONVERSION TIME FROM IMMEDIATELY PRECEDING NSTEP |

| CONVERSION TIME | CONVERTED DATA |
|---|---|
| $T_{CNV1}$ | $DATA_1$ |
| $T_{CNV2}$ | $DATA_2$ |
| $T_{CNV3}$ | $DATA_3$ |
| ⋮ | ⋮ |

SYSTEM, ANALOG TO DIGITAL CONVERTER, AND METHOD OF CONTROLLING SYSTEM

CROSS REFERENCE TO RELATED APPLICATIONS

This application is a U.S. National Phase of International Patent Application No. PCT/JP2016/062244 filed on Apr. 18, 2016, which claims priority benefit of Japanese Patent Application No. JP 2015-129539 filed in the Japan Patent Office on Jun. 29, 2015. Each of the above-referenced applications is hereby incorporated herein by reference in its entirety.

TECHNICAL FIELD

The present technology relates to a system, an analog to digital converter, and a method of controlling the system. More specifically, this relates to a system which sequentially compares an analog signal with a reference signal and converts the same to a digital signal, the analog to digital converter, and the method of controlling the system.

BACKGROUND ART

Conventionally, an analog to digital converter (ADC) is provided for converting an analog signal to a digital signal in various types of electronic devices such as a camera, an audio device, and a measuring device. There are various types of ADCs, but a successive-approximation type ADC is widely used especially because of its small power consumption and circuit scale.

A comparator, a logic circuit, a digital to analog converter (DAC) and the like are provided in the above-described successive-approximation type ADC (for example, refer to Non-Patent Document 1). In the successive-approximation type ADC, the comparator compares input voltage $V_{in}$ to be converted with reference voltage $V_{DAC}$ from the DAC. The logic circuit controls the DAC on the basis of a comparison result and increases or decreases the reference voltage $V_{DAC}$. Comparison by the comparator and adjustment of the reference voltage by the DAC are executed alternately by the same number of times as resolution of the ADC.

CITATION LIST

Non-Patent Document

Non-Patent Document 1: Shuo-Wei Michael Chen et al., A 6-bit 600-MS/s 5.3-mW Asynchronous ADC in 0.13-μm CMOS, IEEE JOURNAL OF SOLID STATE CIRCUITS, VOL. 41. NO. 12, DECEMBER 2006.

SUMMARY OF THE INVENTION

Problems to be Solved by the Invention

However, in the above-described successive-approximation type ADC, the lower the power-supply voltage, the larger variation in operation speed of the circuits in the successive-approximation type ADC. In consideration of this variation, a certain margin must be secured for the power-supply voltage of the successive-approximation type ADC, and there is a problem that it becomes difficult to reduce the power consumption to a requisite minimum at which erroneous operation does not occur.

The present technology is realized in view of such a situation, and an object thereof is to reduce the power consumption of the successive-approximation type analog to digital converter.

Solutions to Problems

The present technology is achieved for solving the above-described problem, and a first aspect thereof is a system provided with an analog to digital converter which compares an analog signal with a reference signal and outputs frequency information indicating the number of times of comparison, and a power-supply voltage generation unit which generates power-supply voltage on the basis of the frequency information to supply to the analog to digital converter, and a method of controlling the same. As a result, there is an effect that the power-supply voltage generated on the basis of the frequency information is supplied to the analog to digital converter.

Also, in the first aspect, a conversion time measurement unit which measures conversion time from when the analog signal is sampled until the number of times of comparison indicated by the frequency information reaches a certain number of times is further provided, in which the power-supply voltage generation unit may generate the power-supply voltage corresponding to the measured conversion time, and the analog to digital converter may include a comparator which compares the analog signal with the reference signal to generate the comparison result, a digital signal holding unit which holds the comparison result each time the comparison result is generated and outputs a signal indicating the held value as a digital signal, a reference signal supply unit which changes a value of the reference signal on the basis of the digital signal to supply to the comparator, and a frequency information output unit which outputs the frequency information. As a result, there is an effect that the power-supply voltage corresponding to the measured conversion time is generated.

Also, in the first aspect, the frequency information output unit may output the frequency information over a period from when the analog signal is sampled until a predetermined sampling period elapses, and the conversion time measurement unit may obtain the conversion time from the number of times of comparison within the sampling period and the predetermined sampling period in a case where the sampling period elapses before the number of times of comparison reaches the certain number of times. As a result, there is an effect that the conversion time is obtained from the number of times of comparison and the sampling period in a case where the sampling period elapses before the number of times of comparison reaches the certain number of times.

Also, in the first aspect, the longer the conversion time, the higher the power-supply voltage which the power-supply voltage generation unit may generate. As a result, there is an effect that the longer the conversion time, the higher the generated power-supply voltage.

Also, in the first aspect, a power-supply voltage calculation unit which obtains a difference between the conversion time and predetermined target time and calculates a set value of the power-supply voltage from the difference is further provided, in which the power-supply voltage generation unit may generate the power-supply voltage according to the set value. As a result, there is an effect that the set value of the power-supply voltage is calculated from the difference between the conversion time and the target time.

Also, in the first aspect, a conversion time holding unit which holds each of the conversion times measured within a predetermined voltage control period is further provided, in which the power-supply voltage calculation unit may calculate a statistic amount of the held conversion times each time the predetermined voltage control period elapses and obtain a difference between the statistic amount and the predetermined target time.

Also, in the first aspect, the conversion time holding unit may further hold the digital signal in association with each of the conversion times, and the power-supply voltage calculation unit may determine a weight coefficient smaller than the weight coefficient for the digital signal of other than a specific value for the digital signal of the specific value and performs weighting calculation of the conversion times by the weight coefficient. As a result, there is an effect that the power-supply voltage is controlled to voltage corresponding to the conversion time subjected to the weighting calculation.

Also, in the first aspect, the power-supply voltage generation unit may supply the power-supply voltage to other than the reference signal supply unit. As a result, there is an effect that the power-supply voltage is supplied to other than the reference signal supply unit.

Also, in the first aspect, a converted data processing unit which corrects the converted data on the basis of a value of the power-supply voltage may further be provided. As a result, there is an effect that the converted data is corrected on the basis of the value of the power-supply voltage.

Also, in the first aspect, the power-supply voltage generation unit may generate the power-supply voltage of each of the plurality of analog to digital converters. As a result, there is an effect that the power-supply voltage of each of a plurality of analog to digital converters is generated.

Also, in the first aspect, the comparator, the digital signal holding unit, the reference signal supply unit, and the frequency information output unit may be provided on an analog to digital conversion chip, and the conversion time measurement unit may be provided on a control chip. As a result, there is an effect that the power-supply voltage of the comparator provided on the analog to digital conversion chip is controlled to voltage corresponding to the conversion time.

Also, in the first aspect, the analog to digital conversion chip may be provided in an analog to digital converter storage casing, and the control chip may be provided in a control unit storage casing. As a result, there is an effect that the power-supply voltage of the comparator provided in the analog to digital converter storage casing is controlled to voltage corresponding to the conversion time.

Also, in the first aspect, a sensor which generates the analog signal and a sample hold circuit which samples the generated analog signal to hold is further provided, in which the sample hold circuit may be provided on the analog to digital conversion chip, the analog to digital conversion chip may be connected to the sensor, and the sensor may be provided on the analog to digital converter storage casing. As a result, there is an effect that the analog signal generated by the sensor is sampled.

Also, in the first aspect, a transmission interface which converts the digital signal to a serial signal to transmit to the control unit storage casing may further be provided. As a result, there is an effect that the digital signal is converted to a serial signal and transmitted.

Also, in the first aspect, a non-contact transmission interface which performs processing of transmitting the digital signal to the control unit storage casing in a non-contact manner and processing of receiving a control signal indicating a control amount of the power-supply voltage from the control unit storage casing in a non-contact manner may further be provided. As a result, there is an effect that the digital signal and the control signal are transmitted and received in a non-contact manner.

Also, in the first aspect, the non-contact transmission interface may receive an alternating-current signal of power corresponding to the power consumption of the analog to digital converter storage casing from the control unit storage casing in a non-contact manner to supply to the comparator. As a result, there is an effect that the power is received in a non-contact manner.

Also, in the first aspect, the non-contact transmission interface may receive the alternating-current signal in which the control signal is superimposed on a carrier wave from the control unit storage casing in a non-contact manner and superimpose the digital signal on a new alternating-current signal generated on the basis of the carrier wave to transmit to the control unit storage casing. As a result, there is an effect that the alternating-current signal with which the control signal or the digital signal is superimposed is transmitted and received.

Also, in the first aspect, the power-supply voltage generation unit may supply the power-supply voltage over a supply period from when sampling of the analog signal is instructed until the number of times of comparison reaches a predetermined number of times and stop supplying the power-supply voltage in a period other than the supply period, and the certain number of times does not necessarily exceed the predetermined number of times. As a result, there is an effect that the power-supply voltage is supplied within the supply period, and the supply of the power-supply voltage is stopped during the period outside the supply period.

Also, a second aspect of the present technology is an analog to digital converter provided with a comparator which compares an analog signal with a reference signal to generate a comparison result, a digital signal holding unit which holds the comparison result each time the comparison result is generated and outputs a digital signal including the comparison result, a reference signal supply unit which changes a value of the reference signal on the basis of the digital signal to supply to the comparator, and a frequency information output unit which outputs frequency information indicating the number of times of comparison of the analog signal as the number of times of comparison. As a result, there is an effect that the frequency information indicating the number of times of comparison of the analog signal as the number of times of comparison is output together with the digital signal.

Effects of the Invention

According to the present technology, it is possible to obtain an excellent effect that the power consumption of the successive-approximation type analog to digital converter may be reduced. Meanwhile, the effects are not necessarily limited to the effects herein described and may be any effect described in the present disclosure.

BRIEF DESCRIPTION OF DRAWINGS

FIG. 5 is a view illustrating an example of operation of the comparator in the first embodiment.

FIG. 6 is a view illustrating an example of operation of a register in the first embodiment.

FIG. 7 is a view illustrating an example of operation of a conversion time measurement unit in the first embodiment.

FIG. 23 is a view illustrating an example of data held in a storage unit in the second embodiment.

MODE FOR CARRYING OUT THE INVENTION

A mode for carrying out the present technology (hereinafter, referred to as an embodiment) is hereinafter described. The description is given in the following order.

1. First Embodiment (Example of Controlling to Voltage corresponding to Conversion Time)
2. Second Embodiment (Example of Controlling to Voltage corresponding to Conversion Time Subjected to Weighting Calculation)
3. Third Embodiment (Example of Controlling Power-Supply Voltages of Plural ADCs according to Conversion Time)
4. Fourth Embodiment (Example of Controlling to Voltage corresponding to Conversion Time in Electronic Device including Plural Chips)
5. Fifth Embodiment (Example of Controlling to Voltage corresponding to Conversion Time in Electronic Circuit System including Plural Casings)
6. Sixth Embodiment (Example of Controlling Power-Supply Voltage of Casing Incorporating Sensor to Voltage corresponding to Conversion Time)
7. Seventh Embodiment (Example of Transmitting/Receiving Serial Signal and Controlling to Voltage corresponding to Conversion Time)
8. Eighth Embodiment (Example of Transmitting Power and Data in Non-Contact Manner and Controlling to Voltage corresponding to Conversion Time)

1. First Embodiment

<Configuration Example of Electronic Device>

Figure 1:
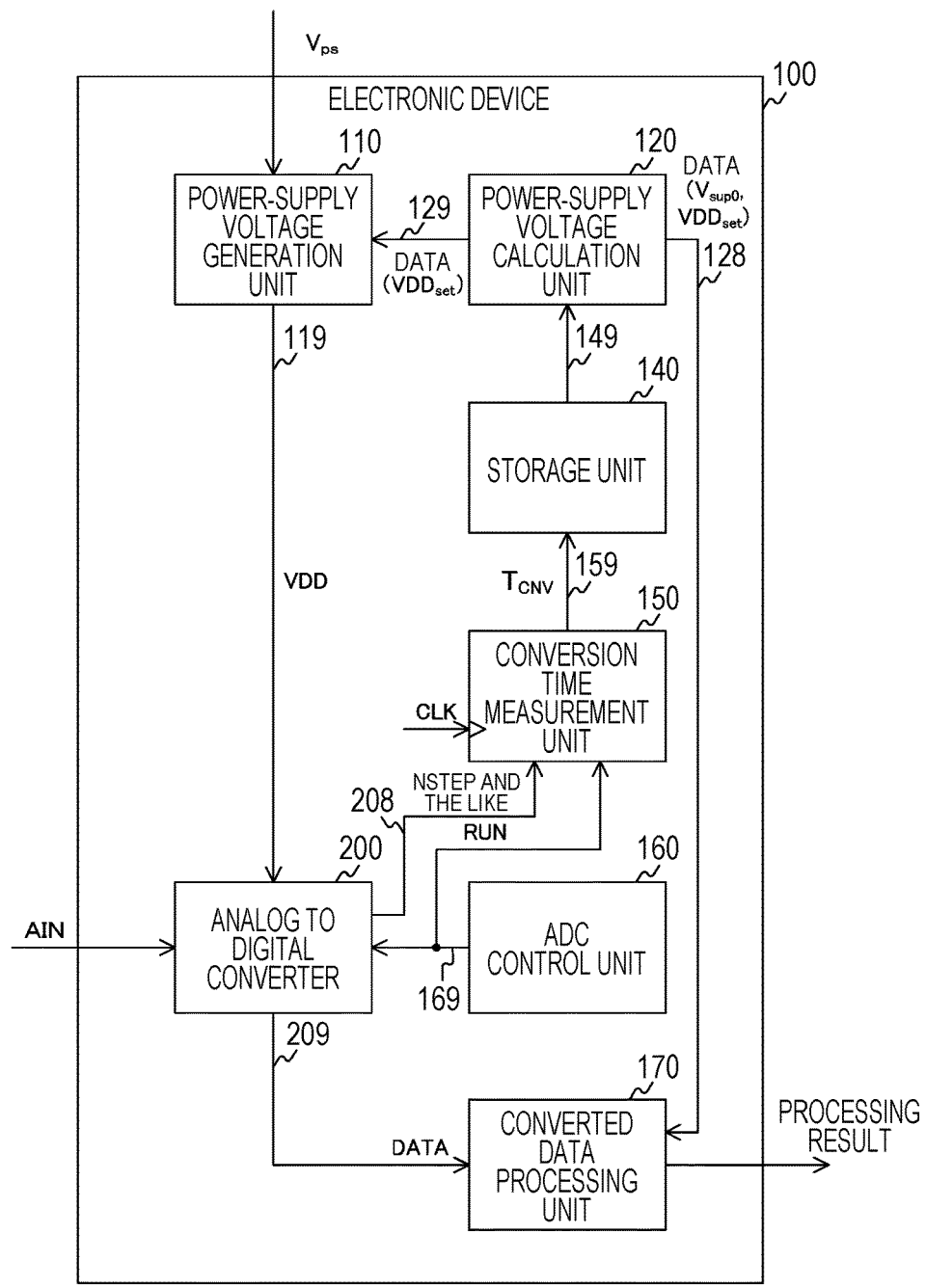
FIG. 1 is a block diagram illustrating a configuration example of an electronic device in a first embodiment.

FIG. 1 is a block diagram illustrating a configuration example of an electronic device 100 in a first embodiment. The electronic device 100 is provided with a power-supply voltage generation unit 110, a power-supply voltage calculation unit 120, a storage unit 140, a conversion time measurement unit 150, an ADC control unit 160, a converted data processing unit 170, and an analog to digital converter 200. The circuits are mounted on the same semiconductor chip, for example.

The analog to digital converter 200 performs analog to digital (AD) conversion on an input analog signal AIN to obtain digital converted data DATA. Each time a start instruction signal RUN is supplied from the ADC control unit 160, the analog to digital converter 200 samples the analog signal AIN and performs the AD conversion to obtain the converted data DATA. In the AD conversion, the analog to digital converter 200 compares the sampled analog signal AIN with an internally generated reference signal N times (N is an integer) and generates a one-bit comparison result for each comparison. Then, the analog to digital converter 200 generates N-bit data including the comparison results as the converted data DATA and supplies the same to the converted data processing unit 170 via a signal line 209. Herein, N is referred to as resolution of the AD conversion and indicates a bit length of an AD converted digital signal.

Also, the analog to digital converter 200 counts a count value each time the analog signal AIN and the reference signal are compared with each other. The analog to digital converter 200 generates a comparison counter value NSTEP indicating the count value and a timing signal NRDY for taking in the NSTEP. The analog to digital converter 200 supplies frequency information including them to the conversion time measurement unit 150 via a signal line 208.

The ADC control unit 160 controls the analog to digital converter 200. When the ADC control unit 160 is instructed by a user or an external device to perform the AD conversion, this generates the start instruction signal RUN each time a predetermined sampling period $T_{spl}$ elapses and supplies the same to the analog to digital converter 200 and the conversion time measurement unit 150 via a signal line 169.

The conversion time measurement unit 150 measures time from when the analog signal AIN is sampled until the number of times of comparison between the analog signal and the reference signal reaches a certain set number of times S as conversion time $T_{CNV}$. The conversion time measurement unit 150 takes in the comparison counter value NSTEP in synchronization with the timing signal NRDY. Then, the conversion time measurement unit 150 measures time until the comparison counter value NSTEP reaches a value corresponding to the set number of times S as the conversion time $T_{CNV}$ and supplies the conversion time $T_{CNV}$ to the storage unit 140 via a signal line 159. Herein, a value equal to or smaller than the resolution (N) of the analog to digital converter 200 is set as the set number of times S. For example, in a case where the resolution N is of 16 bits, S is set to 16. Also, a unit of the conversion time $T_{CNV}$ is, for example, microsecond (μs).

Meanwhile, although the analog to digital converter 200 outputs the frequency information including both the count value (NSTEP) and the timing signal (NRDY), this may also be configured to output the frequency information including only one of them. In a case where the timing signal NRDY is output, the conversion time measurement unit 150 may count the number of times of output of the timing signal NRDY to obtain the number of times of comparison and measure time until the number of times reaches the set number of times S.

The storage unit 140 holds a certain number of conversion times $T_{CNV}$. Meanwhile, the storage unit 140 is an example of a conversion time holding unit recited in claims.

The power-supply voltage calculation unit 120 calculates a voltage control amount ΔV from the conversion time $T_{CNV}$. Each time a predetermined voltage control period elapses, the power-supply voltage calculation unit 120 reads out all of/thinned conversion times $T_{CNV}$ measured within the period from the storage unit 140 and calculates a statistic amount $T_{STAT}$ (for example, an average moving value) of them. Herein, the voltage control period is a period for controlling power-supply voltage of the analog to digital converter 200, and is set to a value equal to or larger than the sampling period, for example.

Then, from the statistic amount ($T_{STAT}$) and predetermined target time $T_{TAG}$, the power-supply voltage calculation unit 120 calculates the voltage control amount ΔV by the following equation. Herein, the target time $T_{TAG}$ is a value equal to or smaller than the sampling period $T_{spl}$, and a unit thereof is, for example, microsecond (μs).

$$\Delta T = T_{STAT} - T_{TAG} \qquad \text{Equation 1}$$

$$\Delta V = f(\Delta T) \qquad \text{Equation 2}$$

In the equation above, f( ) represents a function having an integral element and a proportional element for ΔT. Meanwhile, it is also possible to design while adding a differential element, a dead time element, and a nonlinear element according to a target control characteristic. Also, f( ) represents a function which returns a value in a negative correlation to an input value (ΔT) and is set such that ΔV becomes a value smaller than that before updating in a case where ΔT is a positive value, that is, in a case where the statistic amount $T_{STAT}$ of the conversion times is larger than the target time $T_{TAG}$. As an example, in a case where an integral element output for ΔT is 0, ΔV is set to −0.1 volt if ΔT is +0.1 microsecond, and ΔV is set to +0.1 volt if ΔT is −0.1 microsecond. The voltage control amount ΔV is added to initial voltage $V_{sup0}$ set in a system to generate a power-supply voltage set value $VDD_{set}$ represented by the following equation.

$$VDD_{set} = V_{sup0} + \Delta V \qquad \text{Equation 3}$$

The power-supply voltage calculation unit 120 supplies data indicating the power-supply voltage set value $VDD_{set}$ to the power-supply voltage generation unit 110 via a signal line 129.

Also, the power-supply voltage calculation unit 120 supplies data indicating the calculated power-supply voltage set value $VDD_{set}$ and the initial voltage $V_{sup0}$ of the power-supply voltage to the converted data processing unit 170 via a signal line 128. A unit of $VDD_{set}$ and $V_{sup0}$ is, for example, volt (V).

The power-supply voltage generation unit 110 generates the power-supply voltage VDD of the analog to digital converter 200 according to the power-supply voltage set value $VDD_{set}$ to supply.

A main power supply $V_{ps}$ supplied to the power-supply voltage generation unit 110 may be a direct current obtained by rectifying a commercial power supply or may be a secondary battery or a primary battery.

From equations 1 to 3, the longer the average value $T_{AVG}$ of the conversion times $T_{CNV}$ is, the higher the power-supply voltage VDD is controlled. By this control, the power-supply voltage VDD is adjusted to the voltage when the conversion time $T_{CNV}$ reaches a value ($T_{TAG}$) equal to or smaller than the sampling period $T_{spl}$, that is, when quantization is completed within the sampling period. Therefore, the power-supply voltage generation unit 110 may decrease the power-supply voltage VDD to minimum voltage at which the quantization is completed within the sampling period $T_{spl}$. As a result, it is possible to decrease power consumption of the analog to digital converter 200 to a requisite minimum.

The converted data processing unit 170 performs predetermined processing such as encoding processing and error correction processing on the converted data DATA.

When the power-supply voltage VDD of the analog to digital converter 200 varies, a conversion gain of the analog to digital converter 200 also varies in general. Herein, the conversion gain indicates a ratio of a value of the digital signal (DATA) to a value of the analog signal. A conversion gain Ga when the power-supply voltage VDD is controlled by ΔV changes, for example, by the following equation.

$$Ga = Ga_0 \times V_{sup0}/VDD_{set} \quad \text{Equation 4}$$

In the equation above, $Ga_0$ represents a default conversion gain in a case where the power-supply voltage VDD is not controlled; in this example, the conversion gain is inversely proportional to the power-supply voltage.

In a case where the conversion gain changes on the basis of equation 4, the converted data processing unit 170 corrects the converted data DATA by the following equation, and calculates corrected converted data $DATA_{correct}$. The converted data processing unit 170 outputs the corrected converted data $DATA_{correct}$ as a processing result.

$$DATA_{correct} = DATA \times VDD_{set}/V_{sup0} \quad \text{Equation 5}$$

Herein, since the converted data DATA before correction is a value obtained by multiplying voltage $V_{in}$ of the analog signal AIN by the conversion gain Ga, the following equation is true.

$$DATA = V_{in} \times Ga \quad \text{Equation 6}$$
$$= V_{in} \times Ga_0 \times V_{sup0} / VDD_{set}$$

By substituting equation 6 into equation 5, the following equation is obtained.

$$DATA_{correct} = V_{in} \times Ga_0 \quad \text{Equation 7}$$

As represented by the equation above, the converted data $DATA_{correct}$ independent of the variation of the power-supply voltage VDD is obtained by the correction. As a result, in the electronic device 100 in which the power-supply voltage is dynamically controlled, a stable conversion gain may be obtained. Meanwhile, power-supply voltage dependency of the conversion gain is not limited to a relationship represented by equation 4 and may take an arbitrary characteristic, and a compensation characteristic for this may also be appropriately designed in place of equation 5.

[Configuration Example of Analog to Digital Converter]

Figure 2:
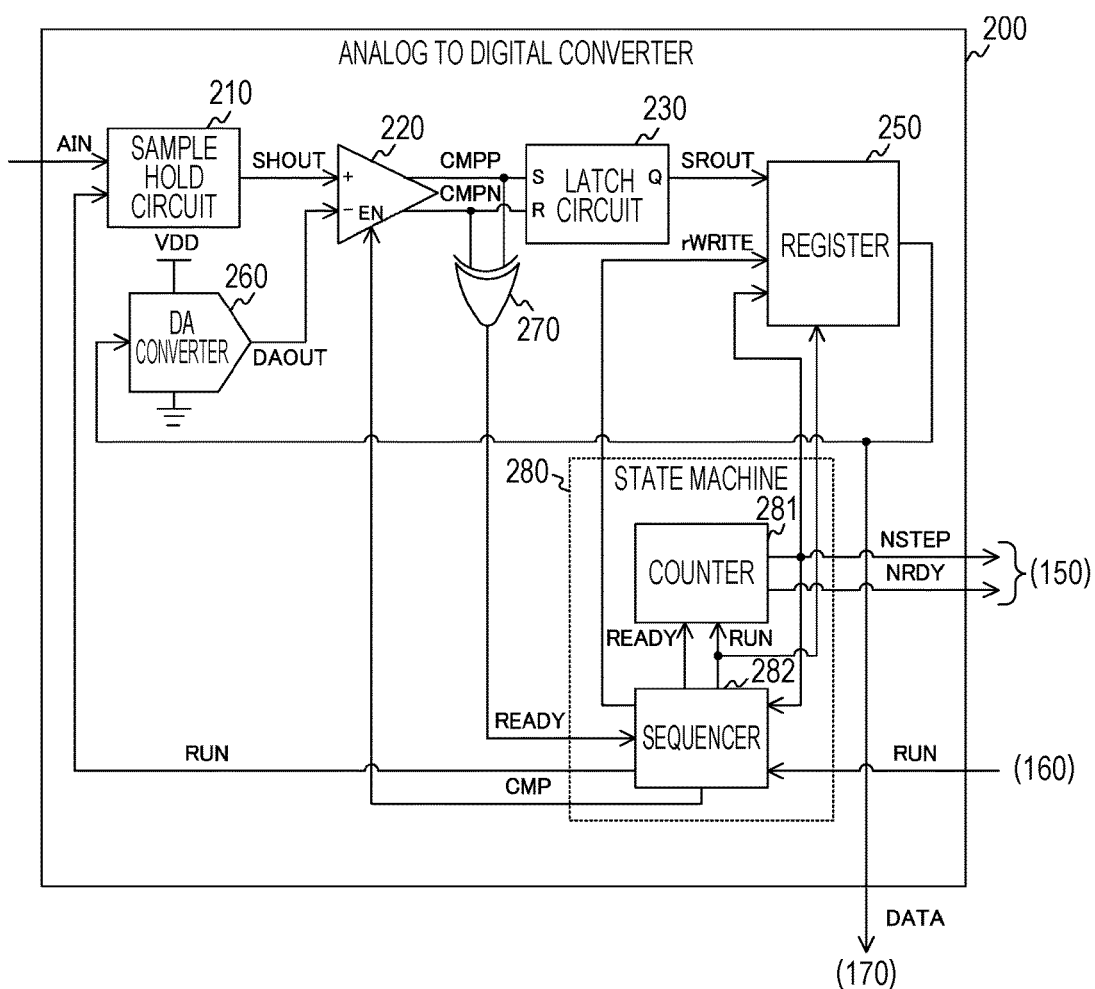
FIG. 2 is a block diagram illustrating a configuration example of an analog to digital converter in the first embodiment.

FIG. 2 is a block diagram illustrating a configuration example of the analog to digital converter 200 in the first embodiment. The analog to digital converter 200 is provided with a sample hold circuit 210, a comparator 220, a latch circuit 230, a register 250, a DA converter 260, an XOR (exclusive OR) gate 270, and a state machine 280. Also, the state machine 280 is provided with a counter 281 and a sequencer 282.

The sample hold circuit 210 samples to hold the analog signal AIN when the start instruction signal RUN is supplied. The sample hold circuit 210 supplies the held analog signal AIN to a non-inverting input terminal (+) of the comparator 220 as a sample hold signal SHOUT.

The comparator 220 compares values (for example, voltage values) between the sample hold signal SHOUT and a reference signal DAOUT from the DA converter 260 according to a comparator control signal CMP. Hereinafter, the voltage of the sample hold signal SHOUT is referred to as "input voltage", and the voltage of the reference signal DAOUT is referred to as "reference voltage". The comparator 220 supplies a differential signal indicating a comparison result to the latch circuit 230 and the XOR gate 270 in a case where the comparator control signal CMP is at a high level. The differential signal includes a positive phase signal COMPP and a negative phase signal COMPN having phases different from each other. On the other hand, in a case where the comparator control signal CMP is at a low level, the comparator 220 outputs the positive phase signal COMPP and the negative phase signal COMPN both at a high level.

The latch circuit 230 holds one-bit information indicated by the differential signal from the comparator 220. The latch circuit 230 is provided with a set terminal S, a reset terminal R, and an output terminal Q. The positive phase signal COMPP is input to the set terminal S, and the negative phase signal COMPN is input to the reset terminal R. The latch circuit 230 holds "1" in a case where the set terminal S is at a high level and the reset terminal R is at a low level, and outputs a latch signal SROUT of the value of a held value from the output terminal Q to the register 250. On the other hand, in a case where the set terminal S is at a low level and the reset terminal R is at a high level, the latch circuit 230 outputs the latch signal SROUT of "0" from the output terminal Q. Also, in a case where the set terminal S and the reset terminal R are both at the high level, the latch circuit 230 holds a state of the output terminal Q.

Meanwhile, in this configuration example, supposing that the positive phase signal COMPP and the negative phase signal COMPN of the comparator 220 are never at the low level at the same time irrespective of a logic level of the comparator control signal CMP, the XOR gate 270 may be replaced with a NAND gate.

Also, in this configuration example, in a case where the comparator control signal CMP is at the low level, the comparator 220 sets both the positive phase signal COMPP and the negative phase signal COMPN to the high level, but it is also possible to configure such that both of them are set to the low level and a logic polarity of the input of the latch circuit 230 is reversed. In this case, suppose that the positive phase signal COMPP and the negative phase signal COMPN of the comparator 220 are never at the high level at the same time irrespective of the logic level of the comparator control signal CMP, the XOR gate 270 may be replaced with an OR gate.

The register 250 holds the latch output signal SROUT in accordance with a write control signal rWRITE and the comparison counter value NSTEP. The register 250 is provided with N flip-flops, and holds the N-bit converted data DATA in the flip-flops.

In a case where the start instruction signal RUN is supplied, the register 250 resets the held converted data DATA to initial data. For example, the converted data DATA is reset to initial data in which a most significant bit (MSB) is "1" and all the remaining bits are "0".

Also, in synchronization with a rising edge of the write control signal rWRITE, the register 250 updates a bit of a digit corresponding to the comparison counter value NSTEP out of the converted data DATA by the latch signal SROUT. For example, the bit of a (N–1–NSTEP)-th digit from the MSB out of the converted data is updated by the latch output signal SROUT. For example, if the comparison counter value NSTEP is "N–1", the MSB is updated. If the comparison counter value NSTEP is "N–2", a next bit of the MSB is updated.

Then, each time the converted data DATA is updated, the register 250 outputs the updated converted data DATA to the converted data processing unit 170 and the DA converter 260. Also, in a period other than the rising edge of the write control signal rWRITE, the register 250 holds a state of the converted data DATA. Meanwhile, the register 250 is an example of a digital signal holding unit recited in claims.

Each time the converted data DATA is output from the register 250, the DA converter 260 updates the value of the reference signal DAOUT on the basis of the converted data DATA. In a case where the converted data DATA is the initial data, the DA converter 260 outputs the reference signal DAOUT of $½×V_{FS}$. Herein, $V_{FS}$ is a maximum amplitude level of the DA converter 260.

Also, when a k (k is an integer from 0 to N−1)-th bit from the MSB out of the converted data DATA is updated to "1", the value of the reference signal DAOUT is updated to $V_{DAOUT\_k}$ by the following equation.

$$V_{DAOUT\_k} = V_{DAOUT\_k-1} + (½)^{k+1} × V_{FS} \quad \text{Equation 8}$$

In the equation above, $V_{DAOUT\_k-1}$ is previous reference voltage.

On the other hand, if the k-th bit of the converted data DATA is updated to "0", the DA converter 260 updates the reference voltage to $V_{DAOUT\_k}$ by the following equation. Meanwhile, the DA converter 260 is an example of a reference signal supply unit recited in claims.

$$V_{DAOUT\_k} = V_{DAOUT\_k-1} - (½)^{k+1} × V_{FS} \quad \text{Equation 9}$$

For example, if the MSB is updated from the initial data "1" to "0", $¼×V_{FS}$ obtained by lowering $½×V_{FS}$ by $¼×V_{FS}$ is supplied as next reference voltage $V_{DAOUT\_1}$. Meanwhile, the DA converter 260 is an example of a reference signal supply unit recited in claims.

In this manner, the analog to digital converter 200 which sequentially compares the analog signal with the reference signal is generally referred to as a successive-approximation type ADC.

The XOR gate 270 generates an exclusive OR signal of the positive phase signal COMPP and the negative phase signal COMPN as a step control signal READY. The XOR gate 270 supplies the step control signal READY to the sequencer 282.

In this example, although it is configured such that the comparator 220 outputs the differential signal and the XOR gate 270 generates the step control signal READY, it is also possible to configure such that the comparator 220 outputs a comparison completion signal at the same time as the comparison result of a single end signal, and the comparison completion signal replaces the step control signal READY. At that time, the XOR gate 270 is not necessary or this may be simply replaced with a buffer or an inverter for the purpose of delay adjustment or logic polarity matching.

The sequencer 282 controls the comparator 220, the register 250, and the counter 281. The sequencer 282 supplies the step control signal READY to the counter 281 to control counting and supplies a signal obtained by inverting the step control signal READY to the register 250 as the write control signal rWRITE. Also, the sequencer 282 supplies the start instruction signal RUN to the sample hold circuit 210, the register 250, and the counter 281.

Also, the sequencer 282 generates N pulses as the comparison control signal CMP over a period from when the start instruction signal RUN is supplied until N times of comparison are completed (for example, when NSTEP is "0"). The comparison control signal CMP is generated by a pulse generator and the like on the basis of a falling edge of the start instruction signal RUN and a rising edge of the step control signal READY. The sequencer 282 supplies the comparison control signal CMP to the comparator 220.

The counter 281 counts the comparison counter value NSTEP in synchronization with the step control signal READY. The comparison counter value NSTEP indicates the number of times of comparison of the sample hold signal SHOUT in the comparator 220. Also, when the start instruction signal RUN is supplied, the counter 281 resets the comparison counter value NSTEP to an initial value (for example, N). Then, the counter 281 decrements the comparison counter value NSTEP in synchronization with the step control signal READY, and supplies the updated comparison counter value NSTEP to the register 250 and the sequencer 282. Also, the counter 281 generates the timing signal NRDY in synchronization with the step control signal READY and supplies the same to the conversion time measurement unit 150 together with the comparison counter value NSTEP. Meanwhile, the counter 281 is an example of a frequency information output unit recited in claims.

Meanwhile, although the counter 281 directly outputs the comparison counter value NSTEP, this may also encode the same and output encoded data. In this case, the conversion time measurement unit 150 may decode the encoded data to process. Also, although a down counter which decreases the comparison counter value NSTEP in synchronization with the step control signal READY is used as the counter 281, an up counter which increases the comparison counter value NSTEP may be used in place of the down counter.

Figure 3:
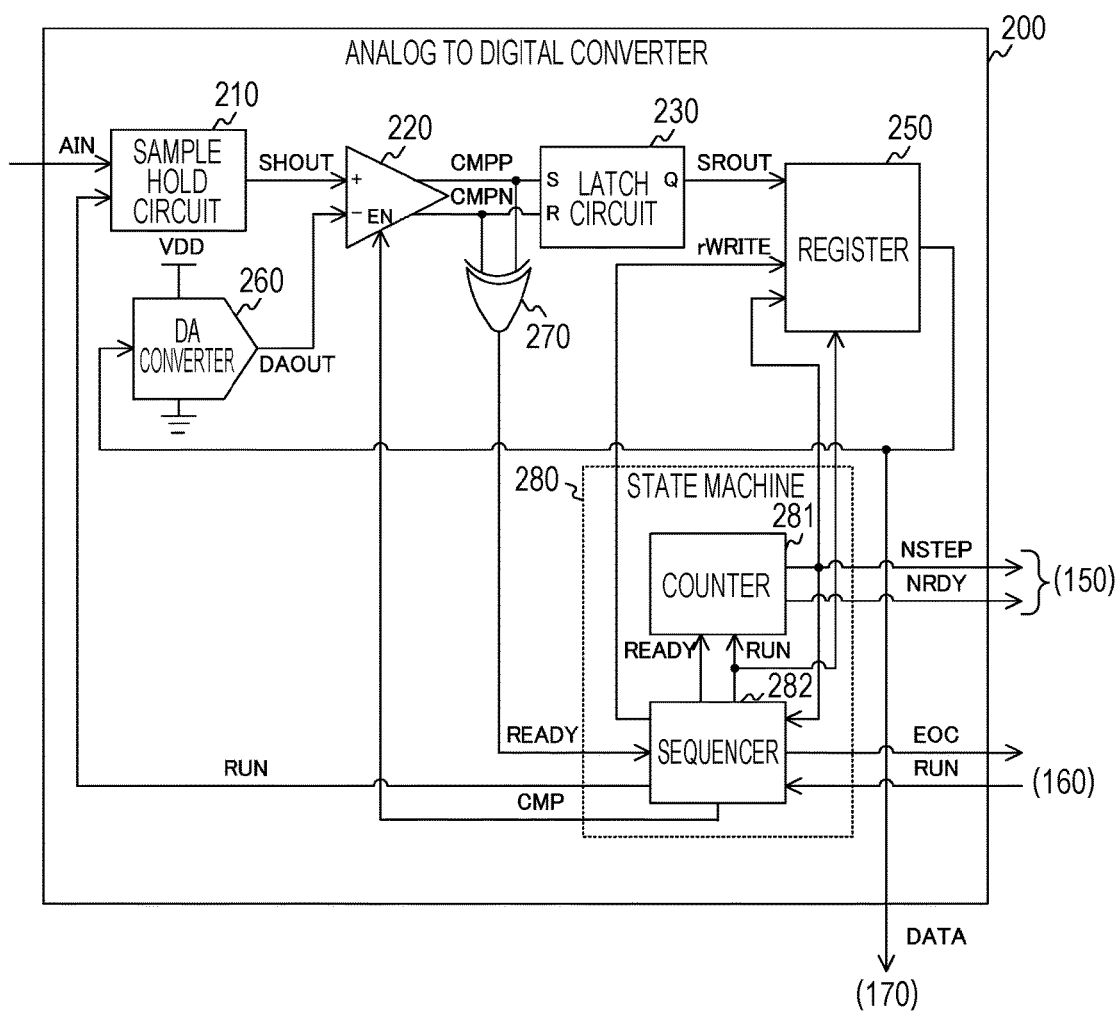
FIG. 3 is a block diagram illustrating a configuration example of the analog to digital converter which externally outputs EOC in the first embodiment.

Also, as illustrated in FIG. 3, the sequencer 282 may further externally output a conversion end signal EOC when the N times of comparison are completed.

As described above, after the start instruction signal RUN is supplied, the comparator 220 operates in synchronization with the timing signal (CMP) generated in the analog to digital converter 200 to generate the converted data DATA. The analog to digital converter 200 operating in synchronization with the internally generated timing signal in this manner is referred to as a self-timing type ADC.

[Configuration Example of Comparator]

Figure 4:
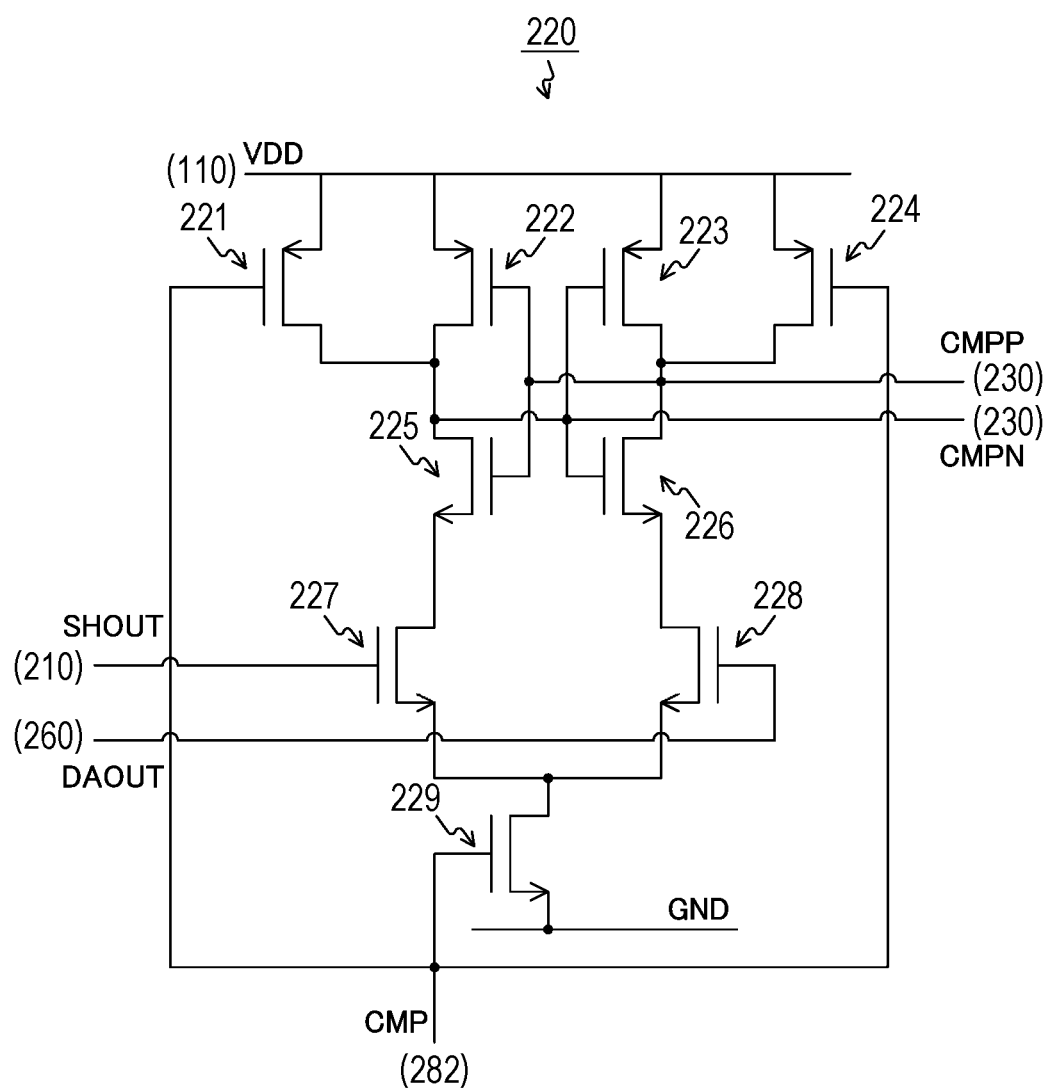
FIG. 4 is a circuit diagram illustrating a configuration example of a comparator in the first embodiment.

FIG. 4 is a circuit diagram illustrating a configuration example of the comparator 220 in the first embodiment. The comparator 220 is provided with transistors 221 to 229. The transistors 221 to 224 are P-type metal-oxide-semiconductor (MOS) transistors, and the transistors 225 to 229 are N-type MOS transistors.

The power-supply voltage VDD is applied to sources of the transistors 221 to 224. Gates of the transistors 221, 224 and 229 are connected to the sequencer 282. Also, a gate of the transistor 227 is connected to the sample hold circuit 210, and a gate of the transistor 228 is connected to the DA converter 260.

Gates of the transistors 222 and 225 and drains of the transistors 223 and 224 are connected to a drain of the transistor 226 and the set terminal S of the latch circuit 230. Also, drains of the transistors 221 and 222 and gates of the transistors 223 and 226 are connected to a drain of the transistor 225 and the reset terminal R of the latch circuit 230. A source of the transistor 225 is connected to a drain of the transistor 227, and a source of the transistor 226 is connected to a drain of the transistor 228. Also, sources of the transistors 227 and 228 are connected to a drain of the transistor 229, and a source of the transistor 229 is connected to a ground terminal.

With such a configuration, in a case where the comparator control signal CMP is "0", the positive phase signal COMPP and the negative phase signal COMPN both at the high level are output. On the other hand, if the comparator control signal CMP is "1", the differential signal (COMPP and COMPN) indicating the comparison result between the sample hold signal SHOUT and the reference signal DAOUT is output.

[Operation Example of Comparator]

FIG. 5 is a view illustrating an example of operation of the comparator 220 in the first embodiment. In a case where the comparator control signal CMP is "0", the comparator 220 outputs the positive phase signal COMPP and the negative phase signal COMPN at the high level irrespective of the value of the sample hold signal.

Also, in a case where the comparator control signal CMP is "1", the comparator 220 compares the voltage (input voltage) of the sample hold signal SHOUT with the voltage (reference voltage) of the reference signal DAOUT. If the input voltage is higher than the reference voltage, the comparator 220 outputs the high-level positive phase signal COMPP and the low-level negative phase signal COMPN. On the other hand, if the input voltage is equal to or lower than the reference voltage, the comparator 220 outputs the low-level positive phase signal COMPP and the high-level negative phase signal COMPN.

FIG. 6 is a view illustrating an example of operation of the register 250 in the first embodiment. First, the N flip-flops forming the register 250 are initialized to a predetermined value when the start instruction signal RUN is at a high level.

Next, when the start instruction signal RUN is at a low level, at the rising edge at which the write control signal rWRITE transits from the low level to the high level, the register 250 refers to the comparison counter value NSTEP and updates the bit of the digit corresponding to NSTEP out of the converted data DATA by the latch output signal SROUT. This holds a state of each of the N flip-flops forming the register 250 in other periods.

[Operation Example of Conversion Time Measurement Unit]

FIG. 7 is a view illustrating an example of operation of the conversion time measurement unit 150 in the first embodiment. The conversion time measurement unit 150 starts clocking the conversion time when the start instruction signal RUN falls. In measuring the conversion time, the conversion time measurement unit 150 counts a timer counter value TIM indicating measured time in synchronization with the clock signal CLK of a constant frequency, for example.

In a case where the start instruction signal RUN is at a low level and the comparison counter value NSTEP is a value other than the value indicating the set number of times S (for example, 0), the conversion time measurement unit 150 continues counting the timer counter value TIM (that is, clocking). Also, in a case where the comparison counter value NSTEP is the value indicating the set number of times S (for example, 0), the conversion time measurement unit 150 ends clocking and outputs the measured time (timer counter value TIM) as the conversion time.

Also, if the comparison counter value NSTEP is not the value indicating the set number of times S (for example, 0) at the time of rising of the start instruction signal RUN, the conversion time measurement unit 150 ends clocking. Then, the conversion time measurement unit 150 calculates the conversion time $T_{CNV}$ from the immediately preceding comparison counter value NSTEP using the following equation and outputs the same.

$$T_{CNV} = \{S/(S-\text{NSTEP})\} \times T_{spl} \qquad \text{Equation 10}$$

In the equation above, $T_{spl}$ represents the sampling period, and a unit thereof is, for example, microsecond (μs).

For example, in a case where the set number of times S is the same value as the resolution "16" and NSTEP when the start instruction signal RUN rises is a value of "1", $(16/15) \times T_{spl}$ is calculated as the conversion time $T_{CNV}$.

[Operation Example of Analog to Digital Converter]

Figure 8:
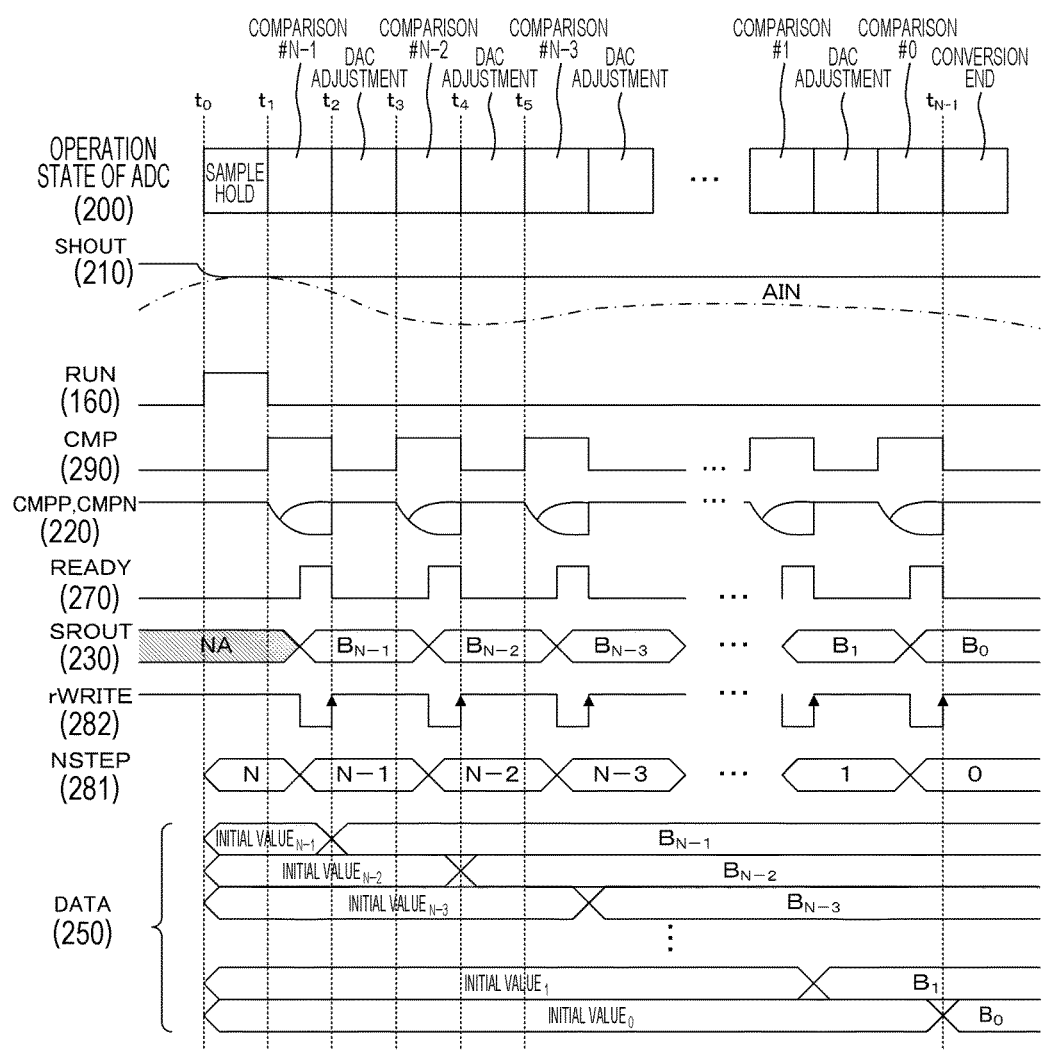
FIG. 8 is a timing chart illustrating an example of operation of the analog to digital converter in the first embodiment.

FIG. 8 is a timing chart illustrating an example of operation of the analog to digital converter 200 in the first embodiment. When the start instruction signal RUN is input at timing $t_0$, the sample hold circuit 210 samples and holds the analog signal AIN and generates the sample hold signal SHOUT. In this drawing, a dashed-dotted line indicates a trajectory of the analog signal AIN and a solid line indicates a trajectory of the sample hold signal SHOUT.

Also, immediately after the timing $t_0$, the comparison counter value NSTEP is reset to the initial value N, and the converted data DATA is reset to the initial data.

When the start instruction signal RUN falls at timing $t_1$ after the timing $t_0$, the comparator 220 compares the input voltage (SHOUT) with the reference voltage (DAOUT) and generates the differential signal (COMPP and COMPN). The XOR gate 270 generates the step control signal READY from the differential signal, and the latch circuit 230 holds the comparison result indicated by the differential signal and outputs the latch output signal SROUT. Then, the sequencer 282 inverts the step control signal READY to generate the write control signal rWRITE.

The counter 281 updates the comparison counter value NSTEP to "N−1" in accordance with the step control signal READY. The register 250 updates the MSB of the converted data DATA to $B_{N-1}$ by the latch output signal SROUT in accordance with the write control signal rWRITE.

At timing $t_2$ at which the MSB is updated by the register 250, the DA converter 260 adjusts the reference signal DAOUT on the basis of the MSB.

When the adjustment of the reference signal DAOUT is completed at timing $t_3$, the comparator 220 compares the input voltage (SHOUT) with the reference voltage (DAOUT) and generates the differential signal again. The XOR gate 270 generates the step control signal READY from the differential signal, and the latch circuit 230 holds the comparison result indicated by the differential signal and outputs the latch output signal SROUT. The counter 281 updates the comparison counter value NSTEP to "N−2" in accordance with the step control signal READY, and the register 250 updates the next bit of the MSB in the converted data DATA to $B_{N-2}$ by the latch output signal SROUT in accordance with the write control signal rWRITE.

At timing $t_4$ at which the next bit of the MSB is updated to $B_{N-2}$ in the register 250, the DA converter 260 adjusts the reference signal DAOUT on the basis of $B_{N-2}$.

Hereinafter, the comparison by the comparator 220 and the adjustment of the reference signal DAOUT by the DA converter 260 are similarly performed alternately.

Figure 9:
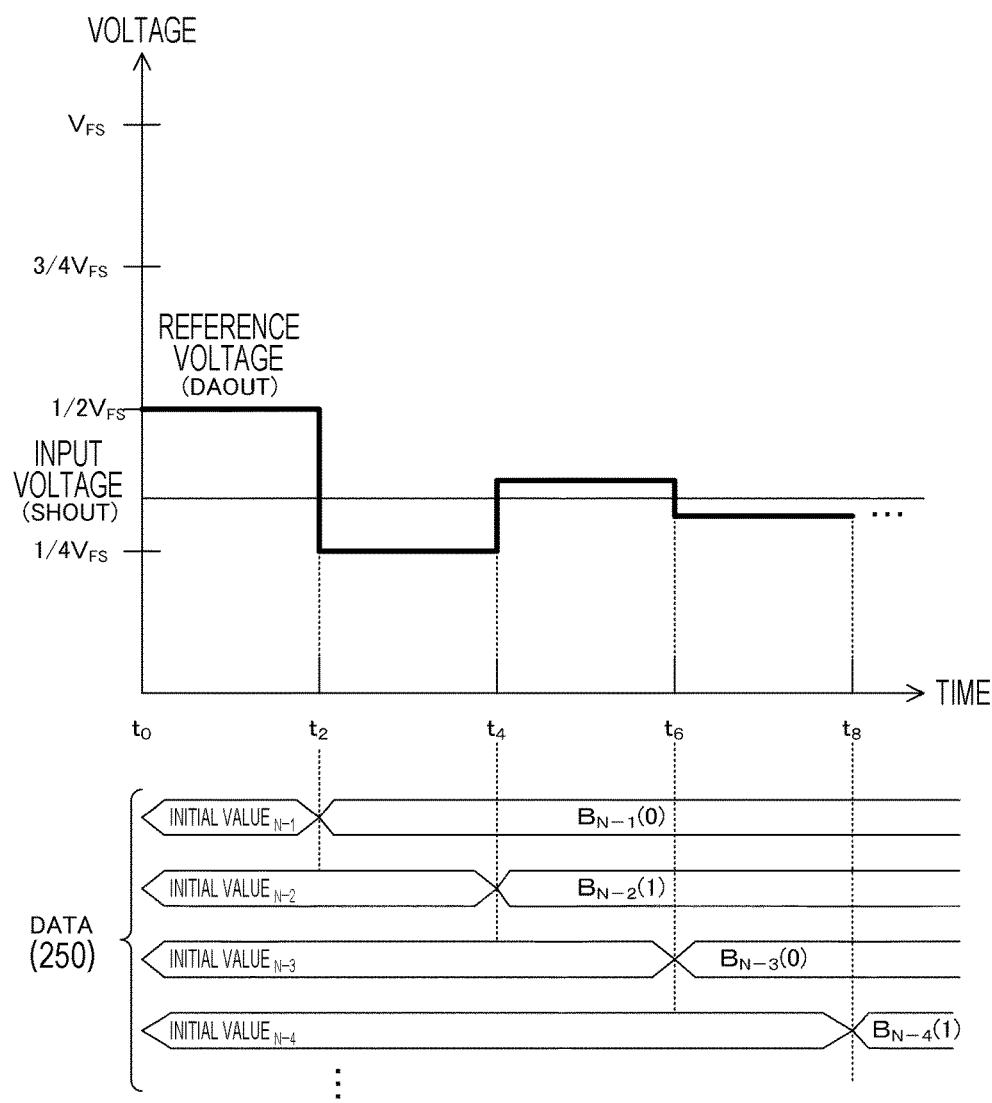
FIG. 9 is a graph illustrating an example of a process of adjusting reference voltage with the lapse of time in the first embodiment.

FIG. 9 is a graph illustrating an example of a process of adjusting the reference voltage with the lapse of time in the first embodiment. In the drawing, the voltages of the sample hold signal SHOUT and the reference signal DAOUT are plotted along the ordinate, and the time is plotted along the abscissa.

When the start instruction signal RUN is input at the timing to, the converted data DATA is initialized to the initial data, and the reference voltage (DAOUT) is initialized to $\frac{1}{2}V_{FS}$. Herein, if the input voltage (SHOUT) is lower than the reference voltage ($\frac{1}{2}V_{FS}$), the MSB of the converted data DATA is updated to "0" at the timing $t_2$. Also, the DA converter 260 decreases the reference signal DAOUT by $\frac{1}{4}V_{FS}$ on the basis of the updated MSB.

If the input voltage is higher than the updated reference voltage ($\frac{1}{4}V_{FS}$), a first bit from the MSB is updated to "1"

at the timing $t_4$. Also, the DA converter 260 increases the reference voltage by $\frac{1}{8}V_{FS}$ on the basis of the updated bit ("1") to obtain $\frac{3}{8}V_{FS}$.

Then, if the input voltage is lower than the updated reference voltage ($\frac{3}{8}V_{FS}$), a second bit from the MSB is updated to "0" at the timing $t_4$. Also, the DA converter 260 decreases the reference voltage by $\frac{1}{16}V_{FS}$ on the basis of the updated bit ("0").

Hereinafter, similarly, the reference voltage is increased/decreased on the basis of the comparison result between the input voltage and the reference voltage, and the converted data DATA including the comparison results is generated.

Figure 10:
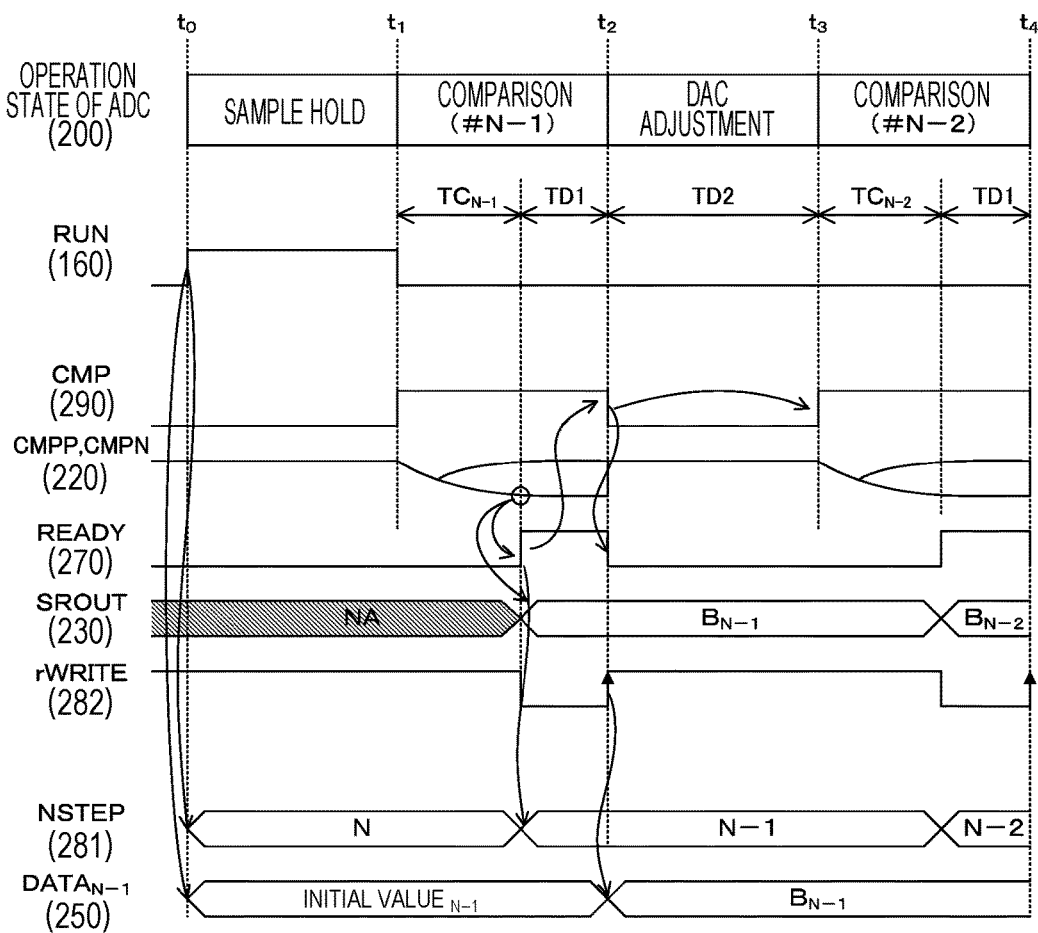
FIG. 10 is a timing chart illustrating the operation of the analog to digital converter in the first embodiment in detail.

FIG. 10 is a timing chart illustrating the operation of the analog to digital converter 200 in the first embodiment in detail. When the start instruction signal RUN is input at the timing $t_0$, the comparison counter value NSTEP is reset to the initial value N, and the converted data DATA is reset to the initial data. In the drawing, $DATA_{N-1}$ indicates the MSB of the converted data DATA.

When the start instruction signal RUN falls at the timing $t_1$ after the timing $t_0$, the comparator 220 generates the differential signal (COMPP and COMPN). The XOR gate 270 generates the step control signal READY from the differential signal when $TC_{N-1}$ elapses from $t_1$, and the latch circuit 230 holds the comparison result indicated by the differential signal and outputs the latch output signal SROUT. Then, the sequencer 282 inverts the step control signal READY to generate the write control signal rWRITE. Herein, $TC_{N-1}$ represents comparison time of the comparator 220. This comparison time includes a component which increases exponentially when amplitude of a differential input of the comparator 220 is small.

The counter 281 updates the comparison counter value NSTEP to "N−1" in accordance with the step control signal READY, and the register 250 updates the MSB of the converted data DATA to $B_{N-1}$ by the latch output signal SROUT in accordance with the write control signal rWRITE.

At the timing $t_2$ after $TC_{N-1}$ and TD1 elapse from the timing $t_1$, the DA converter 260 adjusts the reference signal DAOUT on the basis of the MSB. Then, the adjustment of the reference signal DAOUT is completed at $t_3$ after TD2 elapses from the timing $t_2$. Herein, TD1 and TD2 are fixed values generated by the sequencer 282 using a delay line and the like including a delay element.

Figure 11:
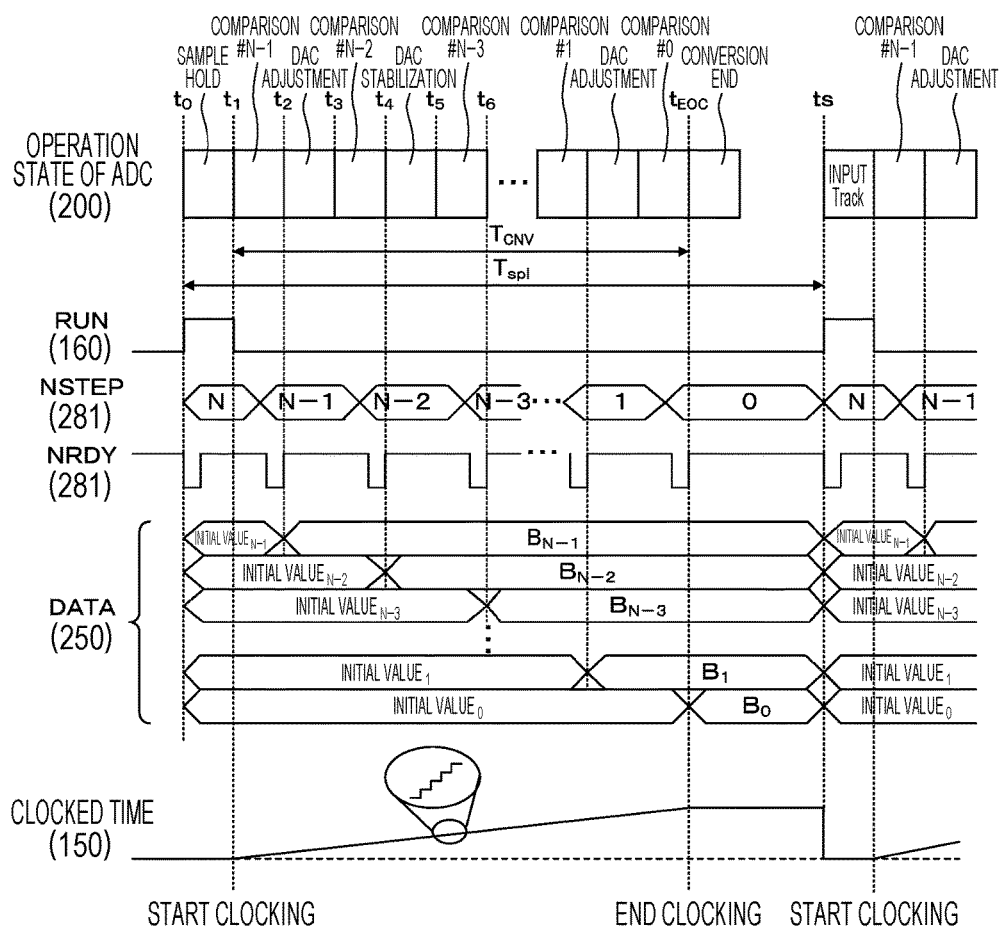
FIG. 11 is a timing chart illustrating an example of operation of the electronic device when power-supply voltage is high in the first embodiment.

FIG. 11 is a timing chart illustrating an example of operation of the electronic device 100 when the power-supply voltage is high in the first embodiment. When the start instruction signal RUN is input at the timing $t_0$, the sample hold circuit 210 samples and holds the analog signal AIN. When the start instruction signal RUN falls at the timing $t_1$, the comparator 220 compares the input voltage (SHOUT) with the reference voltage (DAOUT). At the timing $t_2$ at which the MSB is updated by the comparison result, the DA converter 260 adjusts the reference signal DAOUT on the basis of the MSB.

When the adjustment of the reference signal DAOUT is completed at the timing $t_3$, the comparator 220 compares the input voltage (SHOUT) with the reference voltage (DAOUT) again. At the timing $t_4$ at which the next bit of the MSB is updated by the comparison result, the DA converter 260 adjusts the reference signal DAOUT on the basis of the bit.

Hereinafter, the comparison by the comparator 220 and the adjustment of the reference signal DAOUT by the DA converter 260 are similarly performed alternately. Then, the comparison counter value NSTEP is updated to "0" at timing $t_{EOC}$ before the sampling period $t_{spl}$ elapses from the timing $t_0$, and the A/D conversion ends.

The conversion time measurement unit 150 starts clocking at the timing $t_1$ at which the analog signal AIN is sampled. Then, the conversion time measurement unit 150 takes in the comparison counter value NSTEP in synchronization with the timing signal NRDY. For example, the comparison counter value NSTEP is taken in at timing at which the timing signal NRDY rises to a high level. Then, the clocking is ended at the timing $t_{EOC}$ at which the comparison counter value NSTEP "0" is taken in. As described above, the conversion time measurement unit 150 may take in the comparison counter value NSTEP at the timing controlled in synchronization with the timing signal NRDY, thereby taking in the comparison counter value NSTEP while avoiding timing at which glitch occurs in NSTEP in the state machine 280.

Then, the conversion time measurement unit 150 outputs the measured time as the conversion time $T_{CNV}$. This conversion time $T_{CNV}$ includes time ($TC_{N-1}$ and the like) required for each of the N times of comparison and N TD1 and TD2. The former is the comparison time of the comparator 220 as described above with reference to FIG. 10, and the latter is fixed delay time generated by the sequencer 282.

Herein, the lower the power-supply voltage VDD, the lower gate-to-source voltage $V_{GS}$ of the transistor (such as 221) in the comparator 220 illustrated in FIG. 4, and variation in drain current Id increases due to the decrease in $V_{GS}$. Especially, in a subthreshold region in which $V_{GS}$ is lower than threshold voltage $V_{th}$, the variation in Id becomes larger than that in a non-subthreshold region. Due to the variation in the drain current Id, operating time of the transistor varies, and the comparison time of the comparator 220 including the transistor varies. That is, the lower the power-supply voltage VDD, the larger the variation in the comparison time of the comparator 220, and the larger the variation in the conversion time $T_{CNV}$ including the comparison time. If the varying $T_{CNV}$ becomes longer than the sampling period, the AD conversion is not completed within the sampling period and the error of the converted data DATA drastically increases.

Therefore, the power-supply voltage generation unit 110 controls the power-supply voltage VDD to be higher as the measured conversion time $T_{CNV}$ is longer. As a result, the variation in the conversion time $T_{CNV}$ decreases and the AD conversion is completed within the sampling period, so that the error of the converted data DATA becomes equal to or smaller than an allowable value.

In a case where the conversion time $T_{CNV}$ is not measured as in Patent Document 1, it is necessary to set the power-supply voltage VDD of the analog to digital converter 200 to a sufficiently high value such that the error due to the variation in the conversion time $T_{CNV}$ does not exceed the allowable value. For this reason, it is difficult to decrease the power consumption of the analog to digital converter 200 to the requisite minimum.

In contrast, since the electronic device 100 measures the conversion time $T_{CNV}$ and controls the power-supply voltage VDD to the voltage corresponding to the conversion time $T_{CNV}$, it is possible to decrease the power consumption of the analog to digital converter 200 to the minimum value at which the error does not exceed the allowable value.

Figure 12:
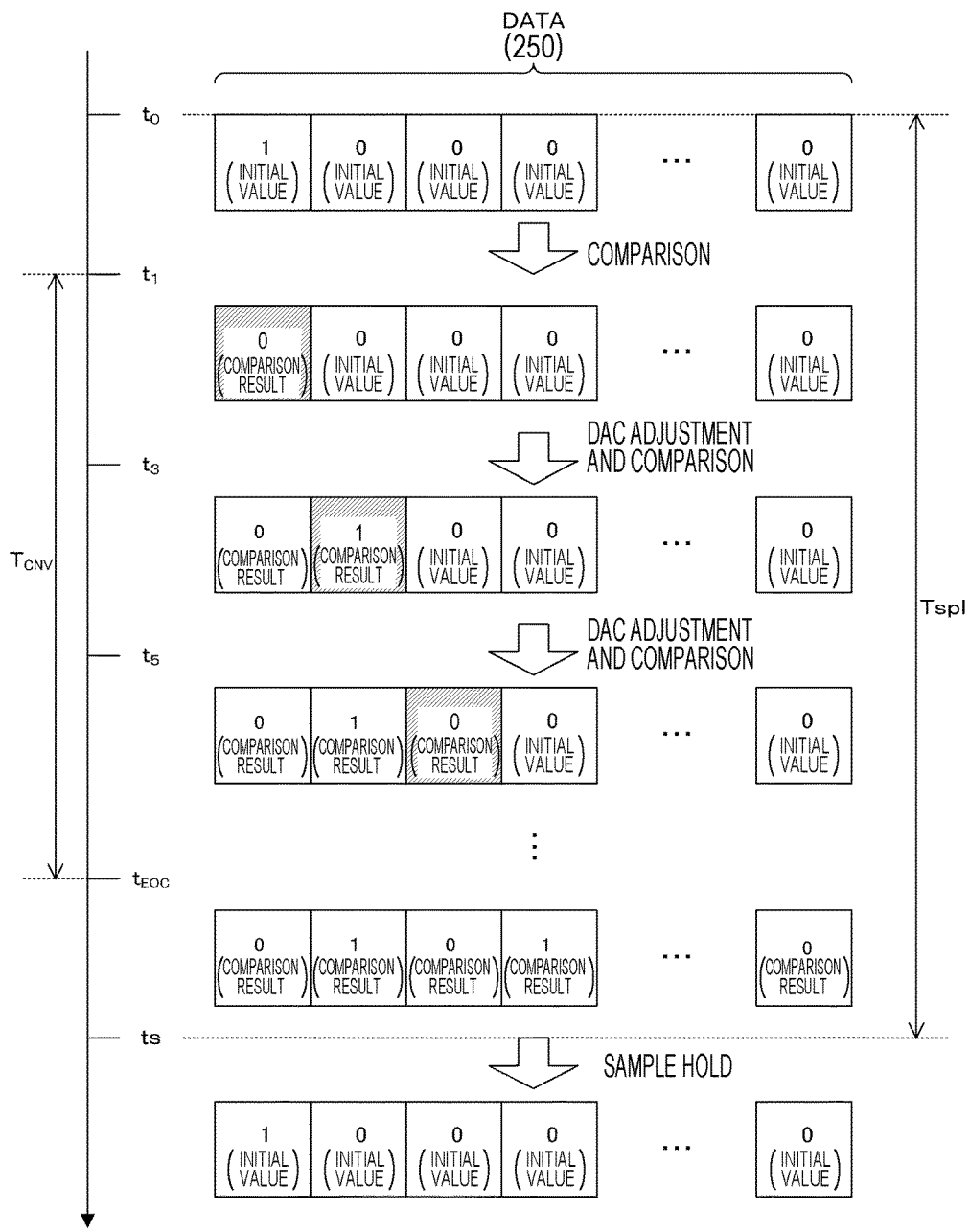
FIG. 12 is a view illustrating an example of converted data when the power-supply voltage is high in the first embodiment.

FIG. 12 is a view illustrating an example of the converted data DATA when the power-supply voltage is high in the first embodiment. When the start instruction signal RUN is input at the timing $t_0$, only a leftmost MSB of the converted data DATA is reset to the initial data of "1". When the start instruction signal RUN falls at the timing $t_1$, the comparator 220 compares the input voltage (SHOUT) with the reference voltage (DAOUT). By the comparison result, the MSB is updated to, for example, "0". Then, the DA converter 260 adjusts the reference signal DAOUT on the basis of the updated MSB.

When the adjustment of the reference signal DAOUT is completed at the timing $t_3$, the comparator 220 compares the input voltage (SHOUT) with the reference voltage (DAOUT) again. By the comparison result, the next bit of the MSB is updated to, for example, "1". Then, the DA converter 260 adjusts the reference signal DAOUT on the basis of the updated bit.

In a case where the power-supply voltage is relatively high, all the bits are updated by the comparison result at the timing $t_{EOC}$ before the sampling period $t_{sp1}$ elapses from the timing $t_0$, and the AD conversion is ended. In this case, the conversion time measurement unit 150 measures the time from the timing $t_1$ to $t_{EOC}$ and outputs the same as the conversion time $T_{CNV}$, and the power-supply voltage generation unit 110 controls the power-supply voltage VDD to the voltage corresponding to the conversion time $T_{CNV}$.

Figure 13:
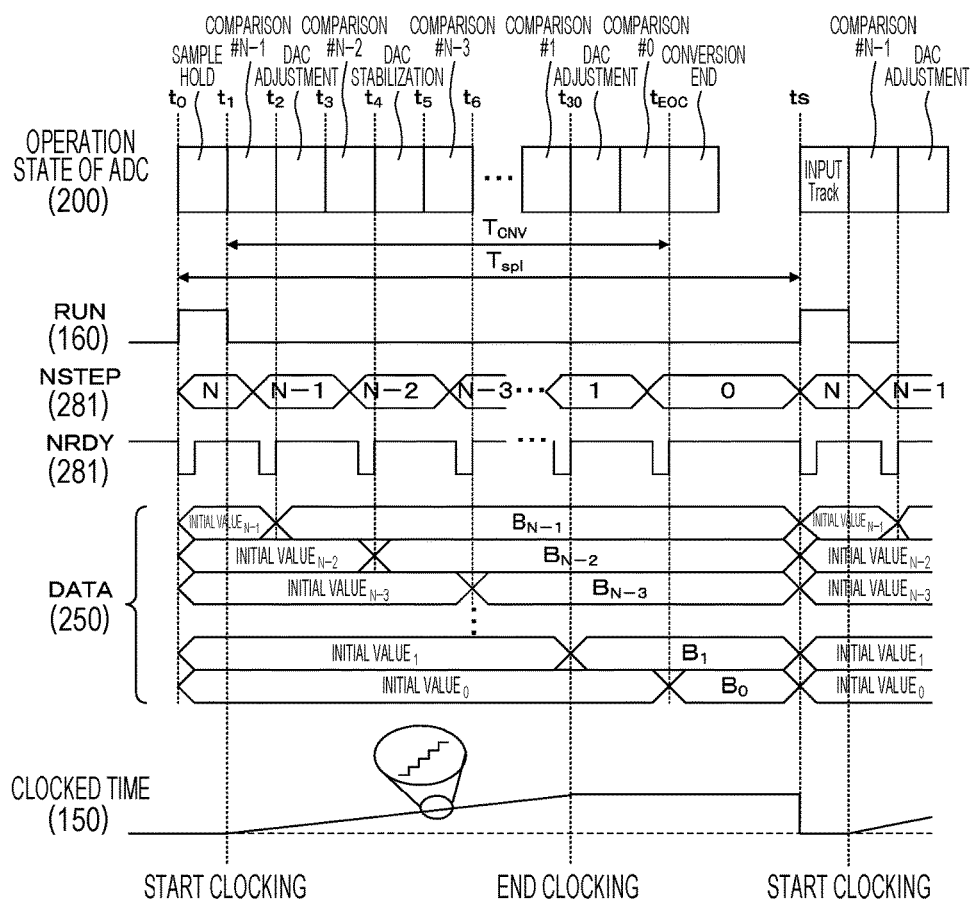
FIG. 13 is a timing chart illustrating an example of the operation of the electronic device when count ending timing is changed in the first embodiment.

Meanwhile, the conversion time measurement unit 150 ends clocking when the number of times of comparison of the analog signal is the resolution N, that is, when the comparison counter value NSTEP is "0" ($t_{EOC}$), but the configuration is not limited to this. As illustrated in FIG. 13, the conversion time measurement unit 150 may end clocking when the number of times of conversion of the analog signal is a predetermined value (for example, 15) smaller than the resolution N, that is, when the comparison counter value NSTEP is "1" ($t_{30}$).

Figure 14:
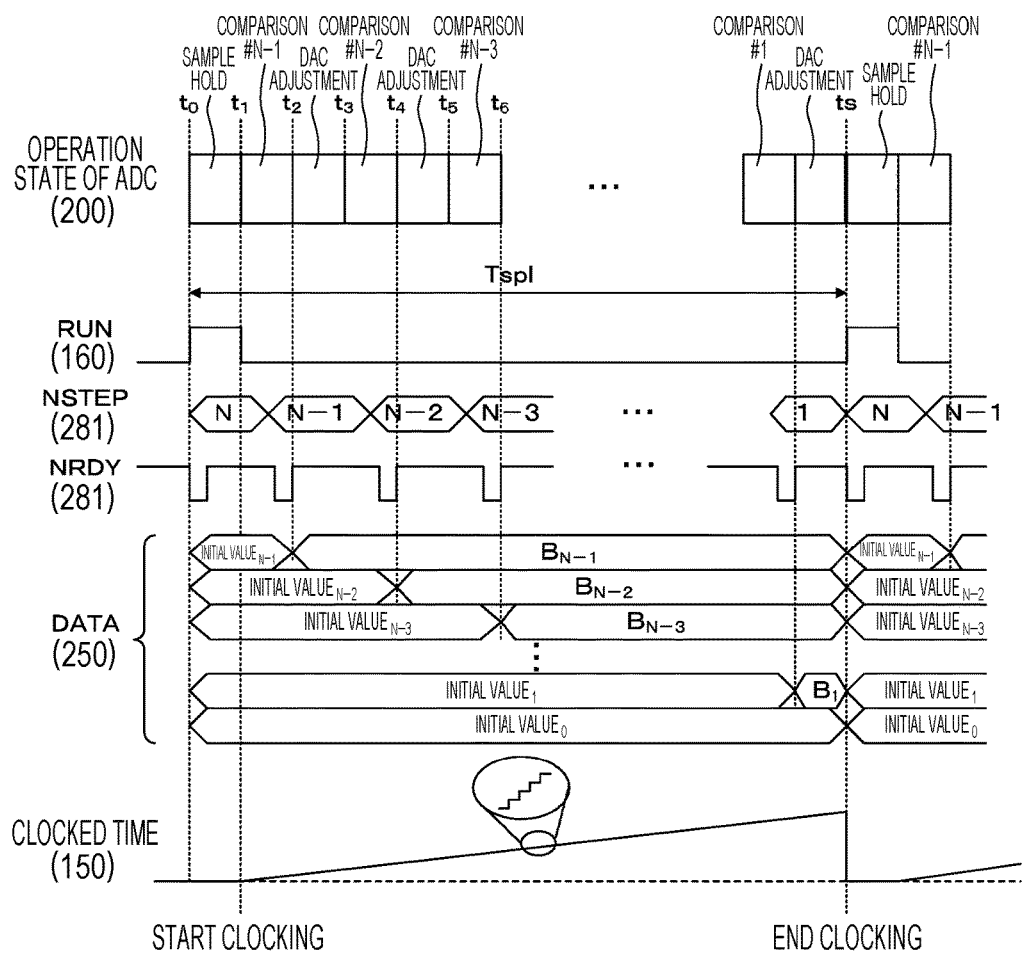
FIG. 14 is a timing chart illustrating an example of the operation of the electronic device when the power-supply voltage is low in the first embodiment.

FIG. 14 is a timing chart illustrating an example of the operation of the electronic device 100 when the power-supply voltage is low in the first embodiment. As described above, the lower the power-supply voltage VDD, the larger the variation in the operating time of the comparator 220 and the DA converter 260. It is assumed that the N times of comparison are not completed at timing $t_s$ at which the sampling period $T_{sp1}$ elapses from the timing $t_0$ due to this variation.

In this case, the conversion time measurement unit 150 ends clocking at the timing $t_s$, and calculates the conversion time $T_{CNV}$ from the immediately preceding comparison counter value NSTEP by using equation 10. Since the analog to digital converter 200 outputs the comparison counter value NSTEP in this manner, the conversion time measurement unit 150 may estimate the conversion time $T_{CNV}$ from NSTEP even in a case where the conversion is not completed within the sampling period.

Figure 15:
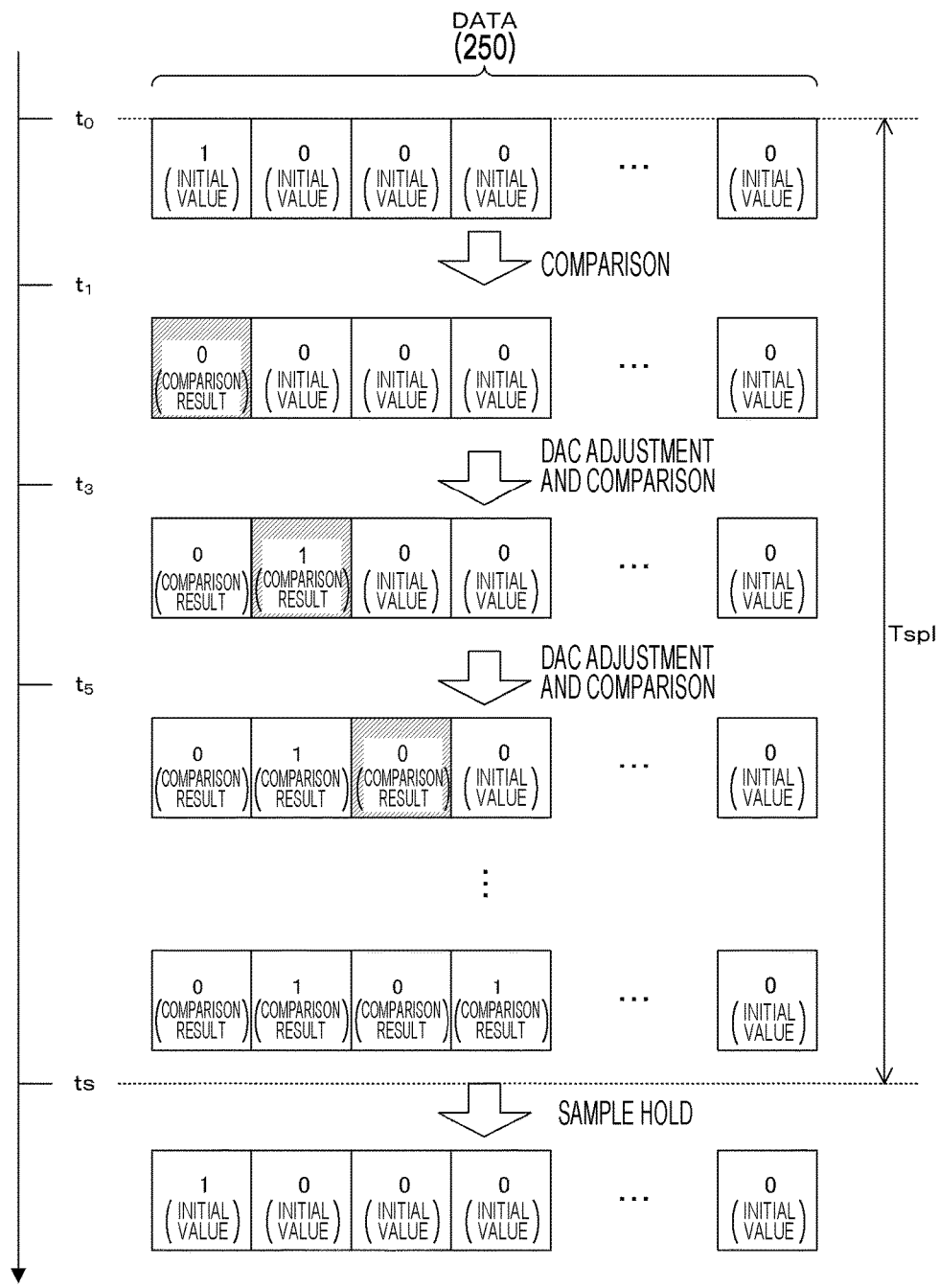
FIG. 15 is a view illustrating an example of the converted data when the power-supply voltage is low in the first embodiment.

FIG. 15 is a view illustrating an example of the converted data DATA when the power-supply voltage is low in the first embodiment. As described above, in a case where the power-supply voltage is relatively low, the variation in the conversion time $T_{CNV}$ becomes large, so that there is a case where the AD conversion is not completed within the sampling period $t_{sp1}$ from the timing to. For example, a least significant bit (LSB) of the converted data DATA is not updated even at a time point ($t_s$) at which the sampling period $t_{sp1}$ elapses from the timing $t_0$ and remains being the initial value. In this case, the conversion time measurement unit 150 ends clocking at the timing $t_s$, and calculates the conversion time $T_{CNV}$ from the immediately preceding comparison counter value NSTEP by using equation 10.

Figure 16:
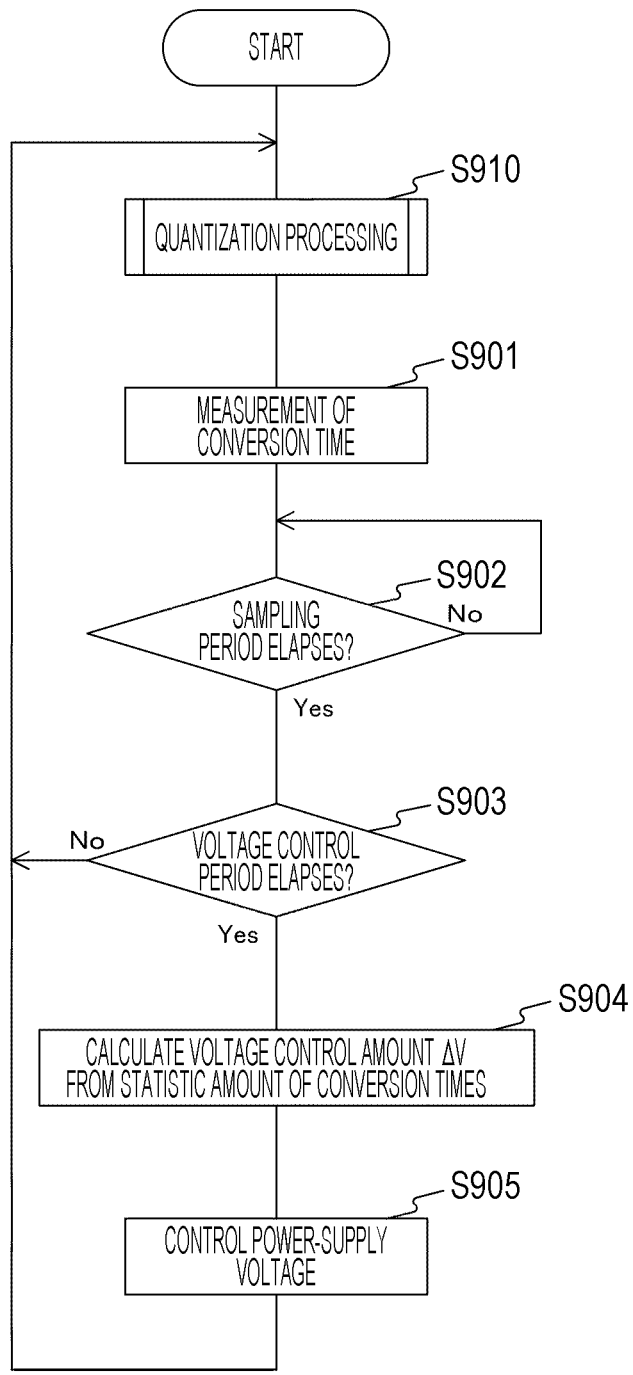
FIG. 16 is a flowchart illustrating an example of the operation of the electronic device in the first embodiment.

FIG. 16 is a flowchart illustrating an example of the operation of the electronic device 100 in the first embodiment. This operation starts when the electronic device 100 is instructed to perform the AD conversion. The electronic device 100 performs quantization processing of converting the analog signal AIN to the converted data DATA (step S910). Also, the electronic device 100 measures the conversion time $T_{CNV}$ (step S901).

Then, the electronic device 100 determines whether the sampling period elapses (step S902). In a case where the sampling period does not elapse (step S902: No), the electronic device 100 repeats step S902.

On the other hand, in a case where the sampling period elapses (step S902: Yes), the electronic device 100 determines whether the voltage control period elapses (step S903). In a case where the voltage control period elapses (step S903: Yes), the electronic device 100 calculates the voltage control amount ΔV from the statistic amount of the conversion time $T_{CNV}$ (step S904) and controls the power-supply voltage VDD by the voltage control amount ΔV (step S905).

In a case where the voltage control period does not elapse (step S903: No), or after step S905, the electronic device 100 repeats step S910 and subsequent steps.

Figure 17:
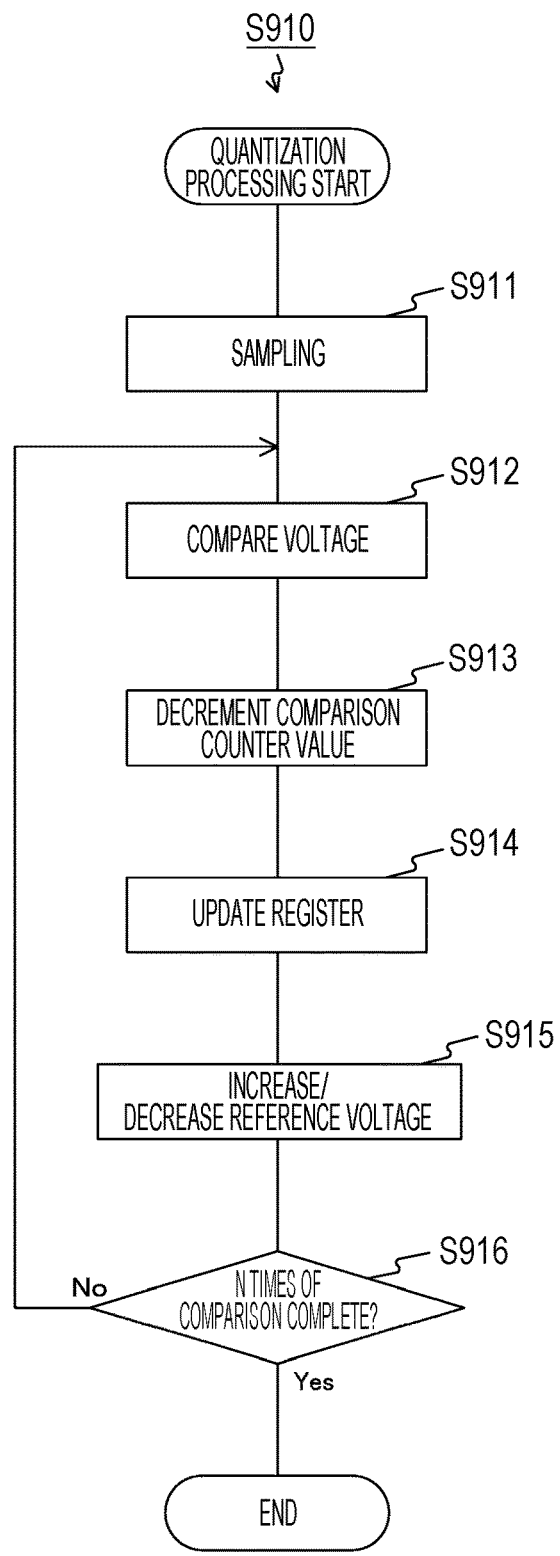
FIG. 17 is a flowchart illustrating an example of quantization processing in the first embodiment.

FIG. 17 is a flowchart illustrating an example of the quantization processing in the first embodiment. The analog to digital converter 200 samples and holds the analog signal AIN (step S911) and compares the input voltage with the reference voltage (step S912). The analog to digital converter 200 decrements the comparison counter value NSTEP (step S913) and updates the register 250 by the comparison result (step S914).

Then, the analog to digital converter 200 increases/decreases the reference voltage on the basis of the comparison result (step S915), and determines whether the N times of comparison are completed (step S916). Under the condition that the sampling period does not elapse (FIG. 16: step S902: No), in a case where the N times of comparison are not completed (step S916: No), the analog to digital converter 200 repeats step S912 and subsequent steps.

In a case where the N times of comparison are completed (step S916: Yes), or in a case where the sampling period elapses (FIG. 16: step S902: Yes), the analog to digital converter 200 ends the quantization processing.

As described above, according to the first embodiment of the present technology, the electronic device 100 measures the time until the number of times of comparison of the analog signal reaches a certain number of times, and controls the power-supply voltage VDD to the voltage corresponding to the time, so that it is possible to decrease the power-supply voltage VDD to the minimum value. As a result, the power consumption of the analog to digital converter 200 may be decreased.

[First Variation]

In the first embodiment described above, the power-supply voltage generation unit 110 controls the power-supply voltages of all the circuits such as the comparator 220 and the DA converter 260 in the analog to digital converter 200. Among them, it is also possible to use a constant voltage power supply which is separately generated in a portion which contributes little to variation in conversion time. An electronic device 100 according to a first variation is different from that of the first embodiment in controlling only power-supply voltage of a part of circuits in an analog to digital converter 200.

Figure 18:
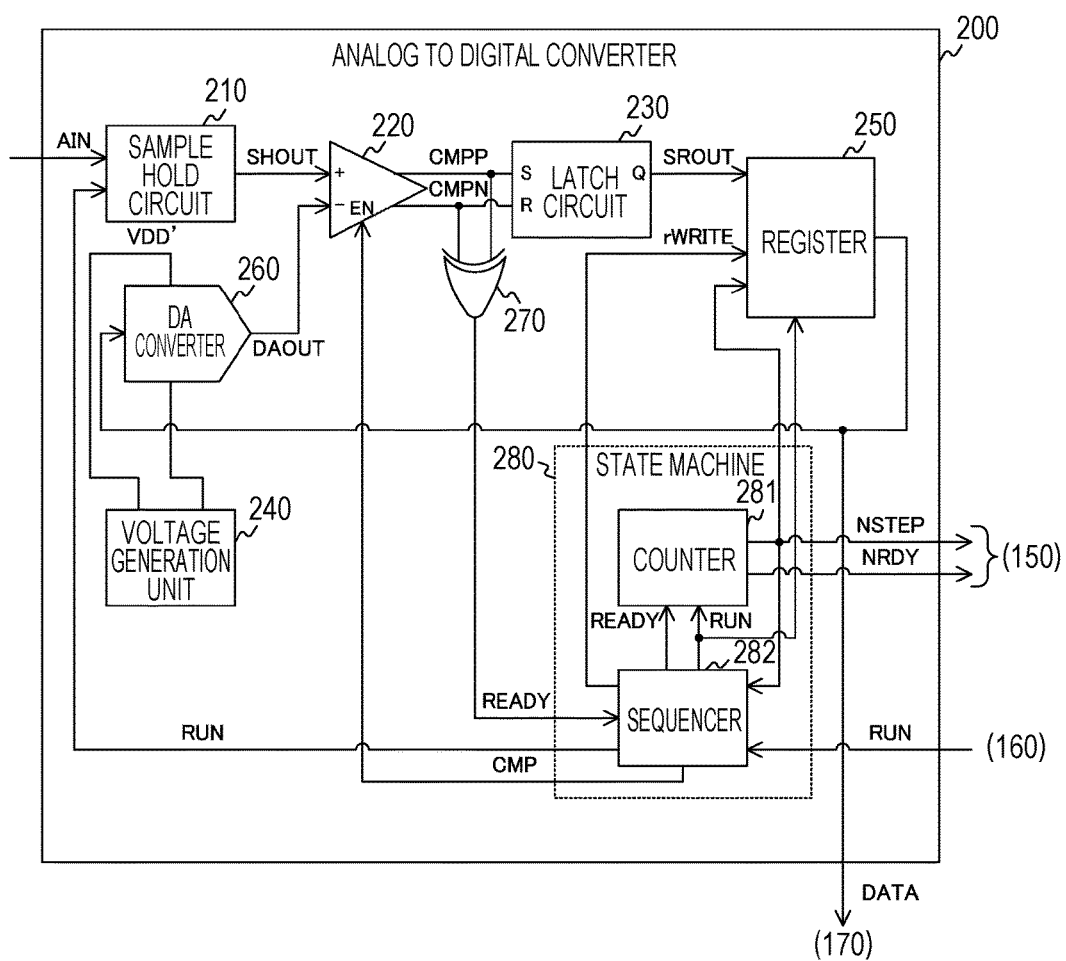
FIG. 18 is a block diagram illustrating a configuration example of an analog to digital converter in a first variation of the first embodiment.

FIG. 18 is a block diagram illustrating a configuration example of the analog to digital converter 200 in the first variation of the first embodiment. The analog to digital converter 200 of the first variation is different from that of the first embodiment in further including a voltage generation unit 240.

The voltage generation unit 240 generates power-supply voltage VDD' and supplies the same to a DA converter 260 together with ground voltage. Also, a power-supply voltage generation unit 110 of the first variation controls only power-supply voltage VDD to a circuit other than the DA converter 260 in the analog to digital converter 200. Meanwhile, although the voltage generation unit 240 is provided inside the analog to digital converter 200, this may also be provided externally. Also, although the voltage generation unit 240 supplies power only to the DA converter 260, the power may also be supplied to a portion which contributes little to the variation in conversion time other than this.

As described above, according to the first variation, the power-supply voltage VDD' of the DA converter becomes constant irrespective of VDD control, and variation in conversion gain of the analog to digital converter 200 caused by the VDD control represented by equation 4 does not occur, so that compensation for the conversion gain represented by equation 5 is not required.

[Second Variation]

In the first embodiment described above, the power-supply voltage generation unit 110 continuously supplies the power-supply voltage VDD to the analog to digital converter 200. However, from the viewpoint of reducing the power consumption, the power-supply voltage generation unit 110 may also intermittently supply the power-supply voltage VDD. A power-supply voltage generation unit of a second variation is different from that of the first embodiment in intermittently supplying power-supply voltage VDD.

Figure 19:
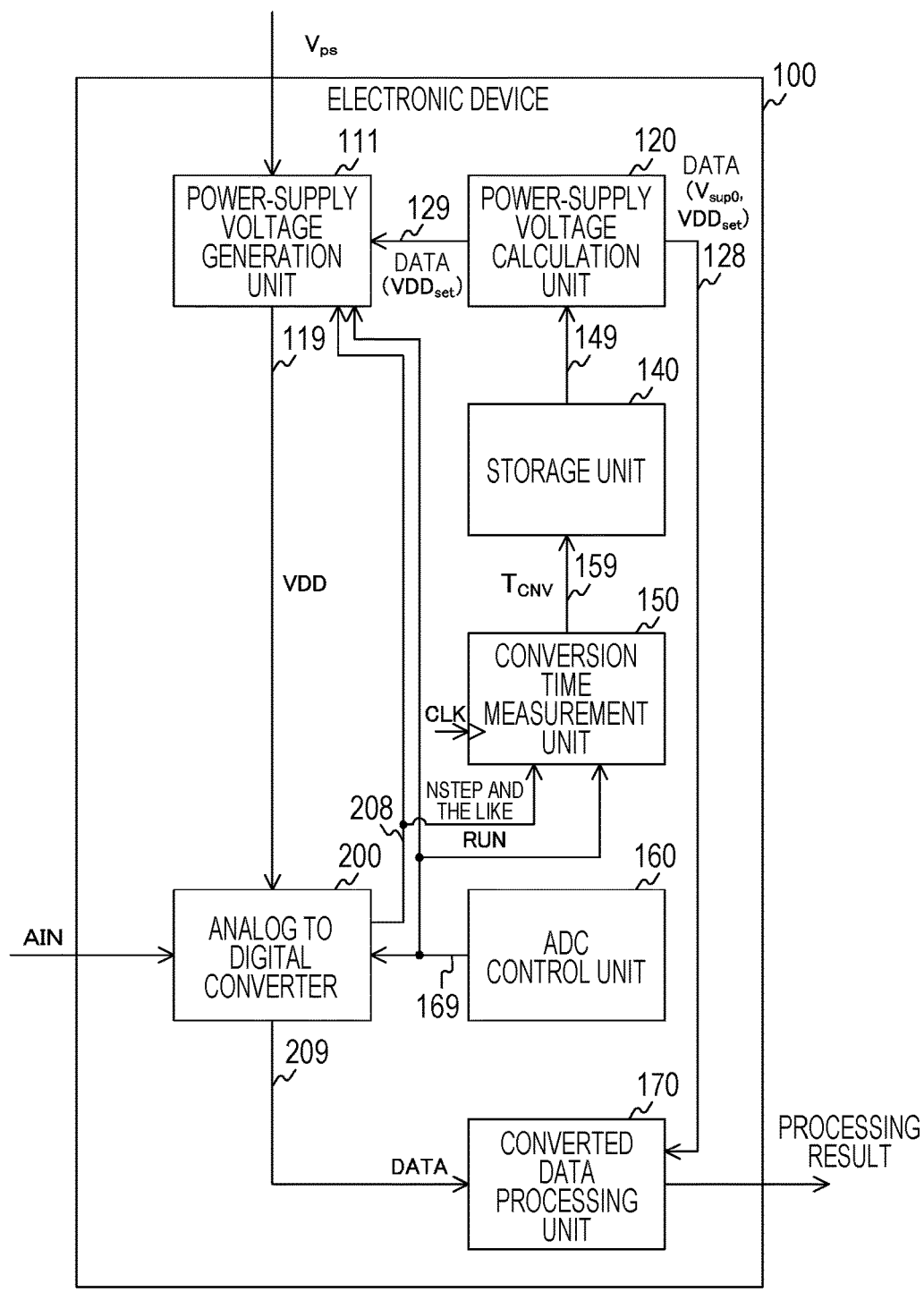
FIG. 19 is a block diagram illustrating a configuration example of an electronic device in a second variation of the first embodiment.

FIG. 19 is a block diagram illustrating a configuration example of an electronic device 100 in the second variation of the first embodiment. The electronic device 100 of the second variation is different from that of the first embodiment in that a power-supply voltage generation unit 111 is provided in place of a power-supply voltage generation unit 110.

Also, an analog to digital converter 200 of the second variation further supplies a comparison counter value NSTEP and a timing signal NRDY to the power-supply voltage generation unit 111. An ADC control unit 160 of the second variation further supplies a start instruction signal RUN to the power-supply voltage generation unit 111.

When the start instruction signal RUN rises, the power-supply voltage generation unit 111 powers on the analog to digital converter 200. Then, when the number of times of comparison reaches a maximum value N in a sampling period, that is, when it is detected that the comparison counter value NSTEP transits to "0", the power-supply voltage generation unit 111 powers off the analog to digital converter 200. However, if the comparison counter value NSTEP does not reach "0" at timing at which the sampling period elapses, the power is continuously supplied.

Figure 20:
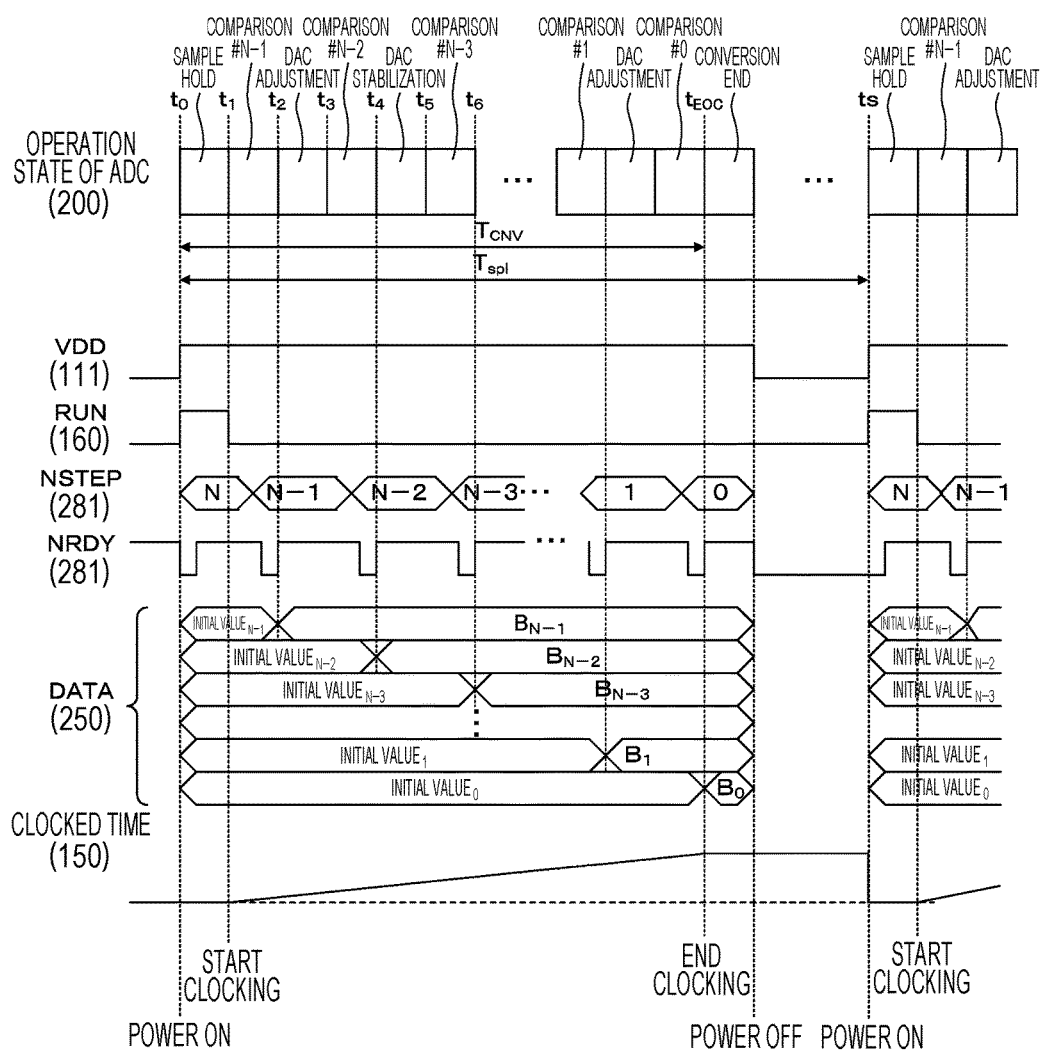
FIG. 20 is a flowchart illustrating an example of operation of the electronic device in the second variation of the first embodiment.

FIG. 20 is a timing chart illustrating an example of operation of the electronic device 100 in the second variation of the first embodiment. When the start instruction signal RUN rises at timing t0, the power-supply voltage generation unit 111 starts supplying the power-supply voltage VDD to the analog to digital converter 200. Then, when detecting that the comparison counter value NSTEP transits to "0" at timing $t_{EOC}$, the power-supply voltage generation unit 111 stops supplying the power-supply voltage VDD.

As described above, according to the second variation of the present technology, the power-supply voltage generation unit 111 supplies the power in a period from the timing $t_0$ to until it is detected that NSTEP transits to "0", and stops the power supply outside the period, so that power consumption may be reduced.

2. Second Embodiment

In the first embodiment described above, the power-supply voltage calculation unit 120 controls the power-supply voltage VDD on the basis of the average value of the conversion times $T_{CNV}$. However, in a case where the converted data DATA includes the error greater than the allowable range, there is a high possibility that a value of the conversion time $T_{CNV}$ measured at that time is abnormally large, and if the value is used, there is a possibility that the power-supply voltage VDD is not controlled to an appropriate value. An electronic device 100 of the second embodiment is different from that of the first embodiment in that an effect of an abnormal value of conversion time $T_{CNV}$ is decreased.

Figure 21:
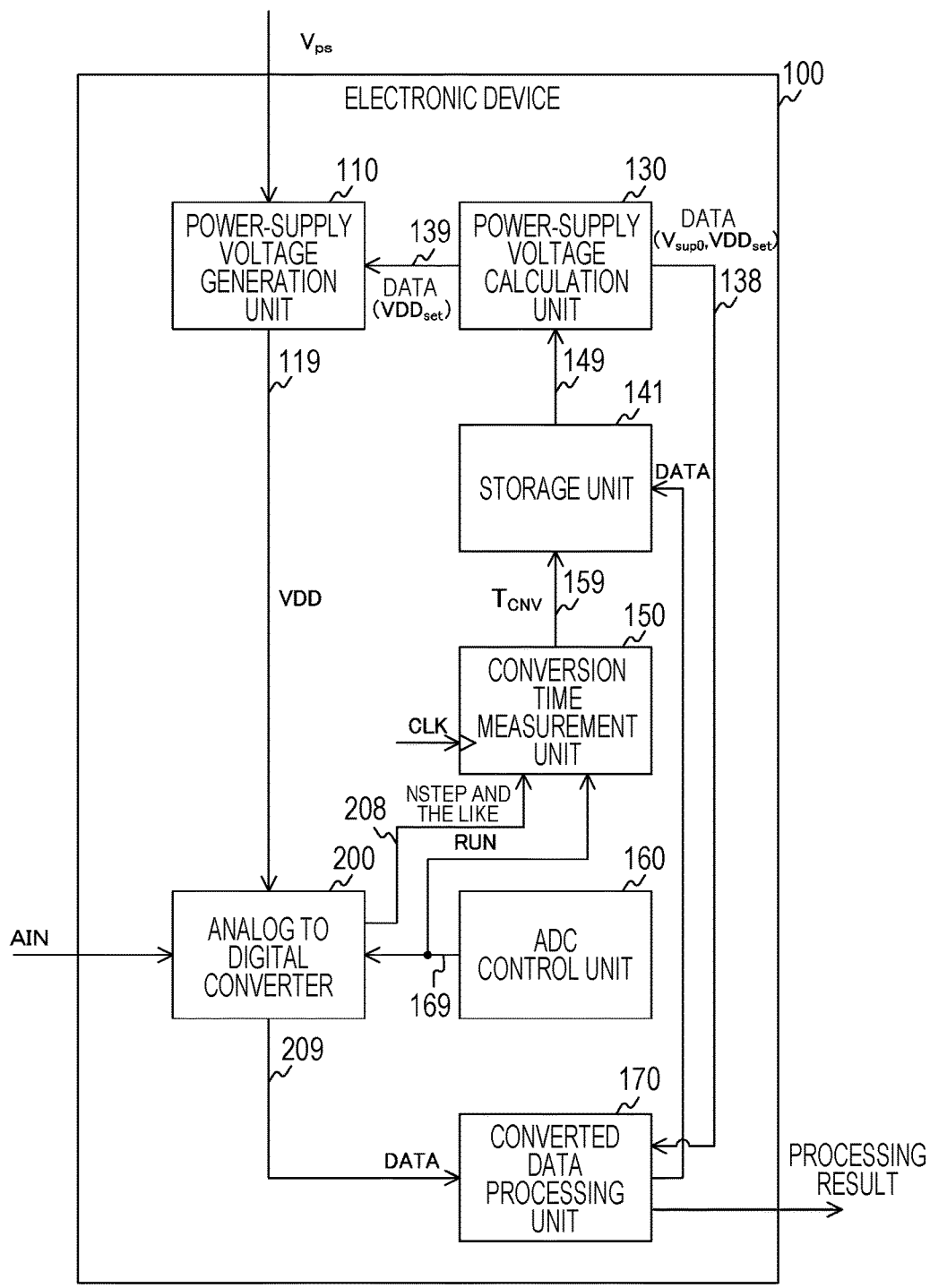
FIG. 21 is a block diagram illustrating a configuration example of an electronic device in a second embodiment.

FIG. 21 is a block diagram illustrating a configuration example of the electronic device 100 in the second embodiment. The electronic device 100 of the second embodiment is different from that of the first embodiment in including a power-supply voltage calculation unit 130 in place of a power-supply voltage calculation unit 120 and including a storage unit 141 in place of a storage unit 140.

Also, a converted data processing unit 170 of the second embodiment further supplies converted data DATA to the storage unit 141. Each time the conversion time $T_{CNV}$ is measured, the storage unit 141 holds the conversion time $T_{CNV}$ and the converted data DATA at that time in association with each other.

The power-supply voltage calculation unit 130 determines a weight coefficient on the basis of the converted data DATA and performs weighting calculation on the conversion times $T_{CNV}$ using the weight coefficient to obtain a statistic amount (for example, a weighted average value). Then, the power-supply voltage calculation unit 130 calculates a voltage control amount ΔV corresponding to the statistic amount.

Figure 22:
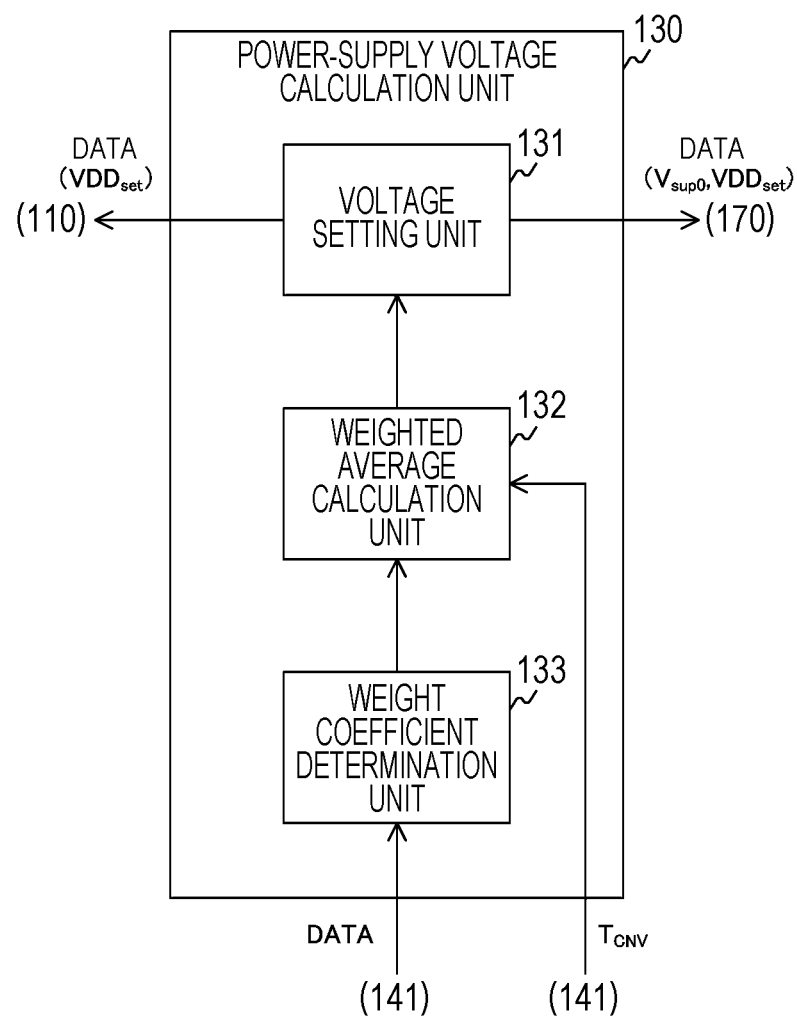
FIG. 22 is a block diagram illustrating a configuration example of a power-supply voltage calculation unit in the second embodiment.

FIG. 22 is a block diagram illustrating a configuration example of the power-supply voltage calculation unit 130 in the second embodiment. The power-supply voltage calculation unit 130 is provided with a voltage setting unit 131, a weighted average calculation unit 132, and a weight coefficient determination unit 133.

The weight coefficient determination unit 133 determines the weight coefficient on the basis of the converted data DATA. Each time a voltage control period elapses, the weight coefficient determination unit 133 reads out the converted data DATA generated within the period from the storage unit 141. Then, the weight coefficient determination unit 133 determines the weight coefficient for each converted data DATA.

Herein, in general, in a case where voltage (SHOUT) of an inverting input terminal (+) and voltage (DAOUT) of an inverting input terminal (−) are substantially coincident with each other, an output of the comparator 220 becomes unstable. This phenomenon is referred to as metastable. When the metastable occurs in the comparator 220, there is a risk that a latch circuit 230 and subsequent circuits on a subsequent stage formed by a general digital circuit technology erroneously operate and the converted data DATA sticks to a specific value depending on a circuit configuration. Therefore, the weight coefficient determination unit 133 determines a small weight coefficient for the converted data DATA which might be generated by the erroneous operation caused by the metastable.

The weight average calculation unit 132 calculates a weighted average of the conversion times $T_{CNV}$. Each time the voltage control period elapses, the weight average calculation unit 132 reads out the conversion times $T_{CNV}$ measured within the period from the storage unit 141, and calculates the weighted average of $T_{CNV}$ by using the weight coefficient determined by the weight coefficient determination unit 133. The weight average calculation unit 132 supplies a calculated weighted average $T_{AVG}$ to the voltage setting unit 131.

The voltage setting unit 131 calculates the voltage control amount $\Delta V$ from the weighted average $T_{AVG}$ to set a power-supply voltage set value $VDD_{set}$. The voltage setting unit 131 calculates the voltage control amount $\Delta V$ using equations 1 and 2. The voltage setting unit 131 supplies data indicating the power-supply voltage set value $VDD_{set}$ obtained from $\Delta V$ to the power-supply voltage generation unit 110 and supplies data indicating the power-supply voltage set value VDDset and initial voltage $V_{sup0}$ to the power-supply voltage generation unit 110 and the converted data processing unit 170.

FIG. 23 is a view illustrating an example of data held in the storage unit 141 in the second embodiment. In the storage unit 141, the converted data DATA is held in association with the conversion time $T_{CNV}$. For example, in a case where converted data DATA' is generated when conversion time $T_am$ is measured, the converted data $DATA_1$ is held in association with the conversion time $T_{CNV1}$. Also, in a case where converted data $DATA_2$ is generated when conversion time $T_{CNV2}$ is measured, the converted data $DATA_2$ is held in association with the conversion time $T_{CNV2}$.

Figure 24:
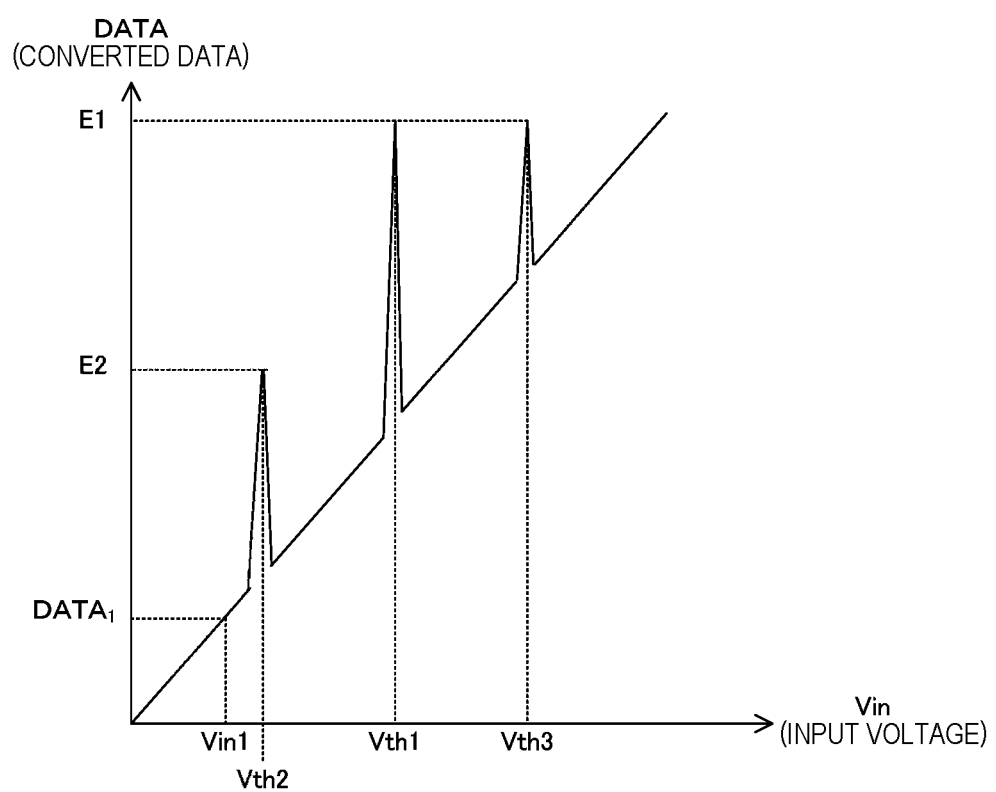
FIG. 24 is a graph illustrating an example of a relationship between an analog signal and converted data in the second embodiment.

FIG. 24 is a graph illustrating an example of a relationship between an analog signal and the converted data in the second embodiment. In the drawing, a value of the converted data DATA is plotted along the ordinate and input voltage $V_{in}$ is plotted along the abscissa.

In this example, in a case where the input voltage $V_{in}$ is a value (for example, $V_{in1}$) different from reference voltage for comparing an upper bit, the input voltage $V_{in}$ is converted to the converted data DATA (for example, DATA') by a constant conversion gain. However, in a case where the input voltage $V_{in}$ substantially coincides with the reference voltage for comparing the upper bit, metastable is likely to occur. For example, if the same input voltage as reference voltage $V_{th1}$ in first comparison or reference voltage $V_{th2}$ or $V_{th3}$ and the like in second comparison is input, the metastable occurs. In this case, the analog to digital converter 200 erroneously operates and outputs a specific value (E1, E2 and the like) depending on the circuit configuration. For this conversion time $T_{CNV}$ with the converted data E1 and E2 suspected of the erroneous operation, a relatively small weight coefficient is selected and the weighted average is obtained using these weight coefficients.

As described above, according to the second embodiment of the present technology, the electronic device 100 performs the weighting calculation of the conversion time while making the weight coefficient small for the converted data possibly caused as a result of the erroneous operation due to the metastable, so that it is possible to decrease an effect of the error caused by the metastable.

3. Third Embodiment

Although the power-supply voltage generation unit 110 controls the power-supply voltage of one analog to digital converter 200 in the first embodiment described above, it is also possible to control the power-supply voltages of a plurality of analog to digital converters 200. A power-supply voltage generation unit 110 according to a third embodiment is different from that of the first embodiment in that power-supply voltages of a plurality of analog to digital converters 200 are controlled.

Figure 25:
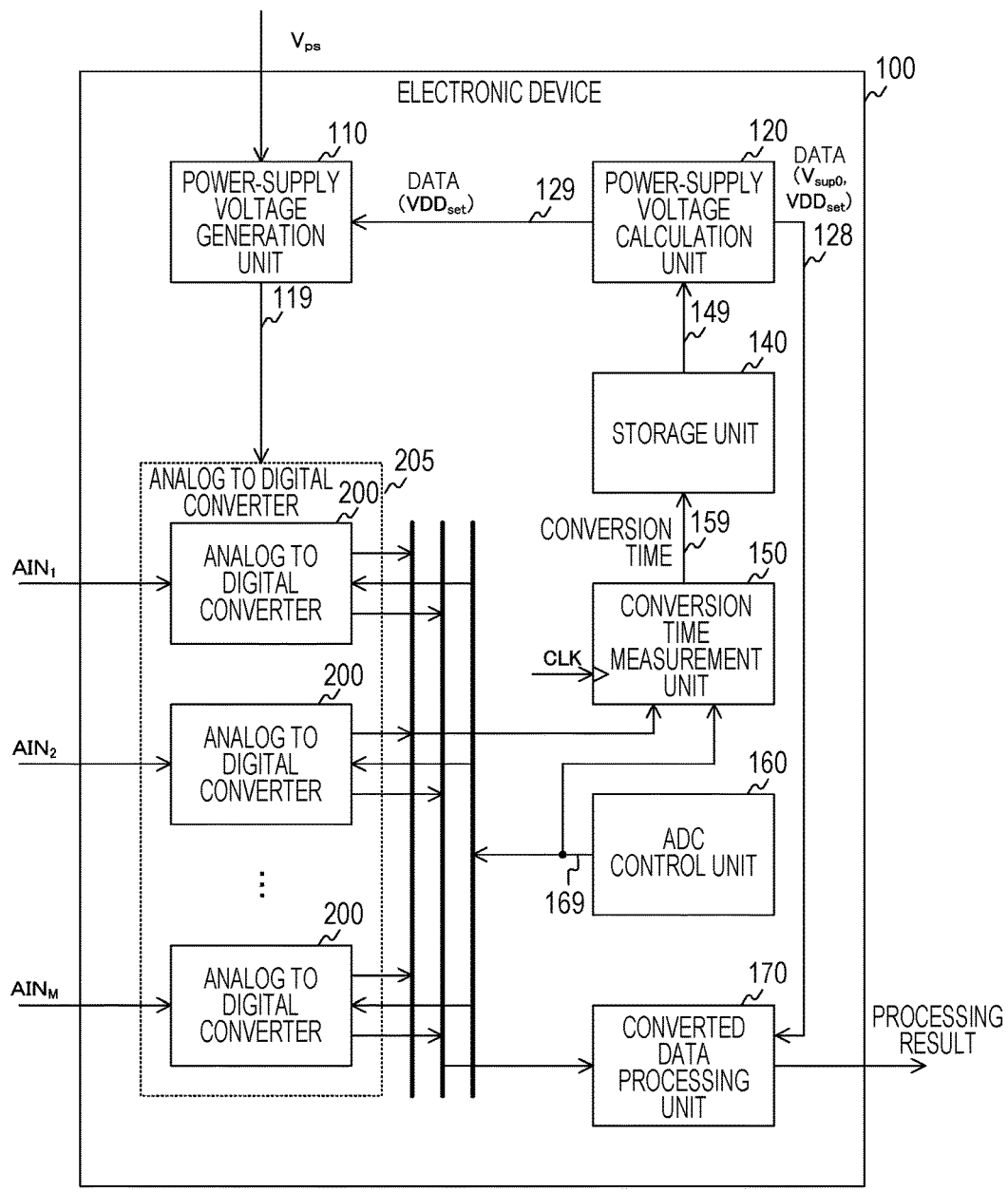
FIG. 25 is a block diagram illustrating a configuration example of an electronic device in a third embodiment.

FIG. 25 is a block diagram illustrating a configuration example of an electronic device 100 in the third embodiment. The electronic device 100 of the third embodiment is different from that of the first embodiment in that an analog to digital conversion unit 205 including M (M is an integer not smaller than 2) analog to digital converters 200 is provided in place of one analog to digital converter 200.

An ADC control unit 160 of the third embodiment supplies a start instruction signal to M analog to digital converters 200 to start AD conversion. The ADC control unit 160 may allow the M analog to digital converters 200 to start the AD conversion at the same time or at different timings.

Each of the M analog to digital converters 200 supplies converted data to a converted data processing unit 170, and supplies frequency information (comparison counter value and timing signal) to a conversion time measurement unit 150.

Also, the conversion time measurement unit 150 of the third embodiment calculates M conversion times from M comparison counter values. The conversion time measurement unit 150 allows a storage unit 140 to hold a statistic amount (average value and maximum value) ST of the M conversion times.

The power-supply voltage generation unit 110 of the third embodiment calculates a statistic amount ($T_{AVG}$) of the statistic amounts ST calculated within a power-supply voltage period, and calculates a voltage control amount by a method similar to that of the first embodiment. The power-supply voltage generation unit 110 of the third embodiment collectively controls the power-supply voltages of the M analog to digital converters 200.

Meanwhile, although the power-supply voltage generation unit 110 collectively controls the power-supply voltages of the M analog to digital converters 200, this may also individually control the power-supply voltage for each analog to digital converter 200. In this case, the conversion time measurement unit 150 does not calculate the statistic amount of the M conversion times and allows the storage unit 140 to hold each time for each analog to digital converter 200, and the power-supply voltage calculation unit 120 calculates the voltage control amount individually for each analog to digital converter 200.

However, in a case where the M analog to digital converters 200 are mounted on the same chip, conditions of process and temperature are substantially the same, so that optimum operating voltages are also substantially the same. Therefore, in a case where the M analog to digital converters 200 are provided on the same chip, it is desirable that the power-supply voltage generation unit 110 collectively controls the power-supply voltages of the M analog to digital converters 200.

As described above, according to the third embodiment of the present technology, the power-supply voltage generation unit 110 controls the power-supply voltages of a plurality of analog to digital converters 200 to values corresponding to the conversion time, so that it is possible to decrease power consumption of a plurality of analog to digital converters 200.

4. Fourth Embodiment

Although the circuits such as the ADC control unit 160 and the analog to digital converter are provided on the same semiconductor chip in the electronic device 100 in the first embodiment described above, they may be dispersedly provided on a plurality of semiconductor chips. An electronic device 100 of a fourth embodiment is different from that of the first embodiment in that circuits are dispersedly provided on a plurality of semiconductor chips.

Figure 26:
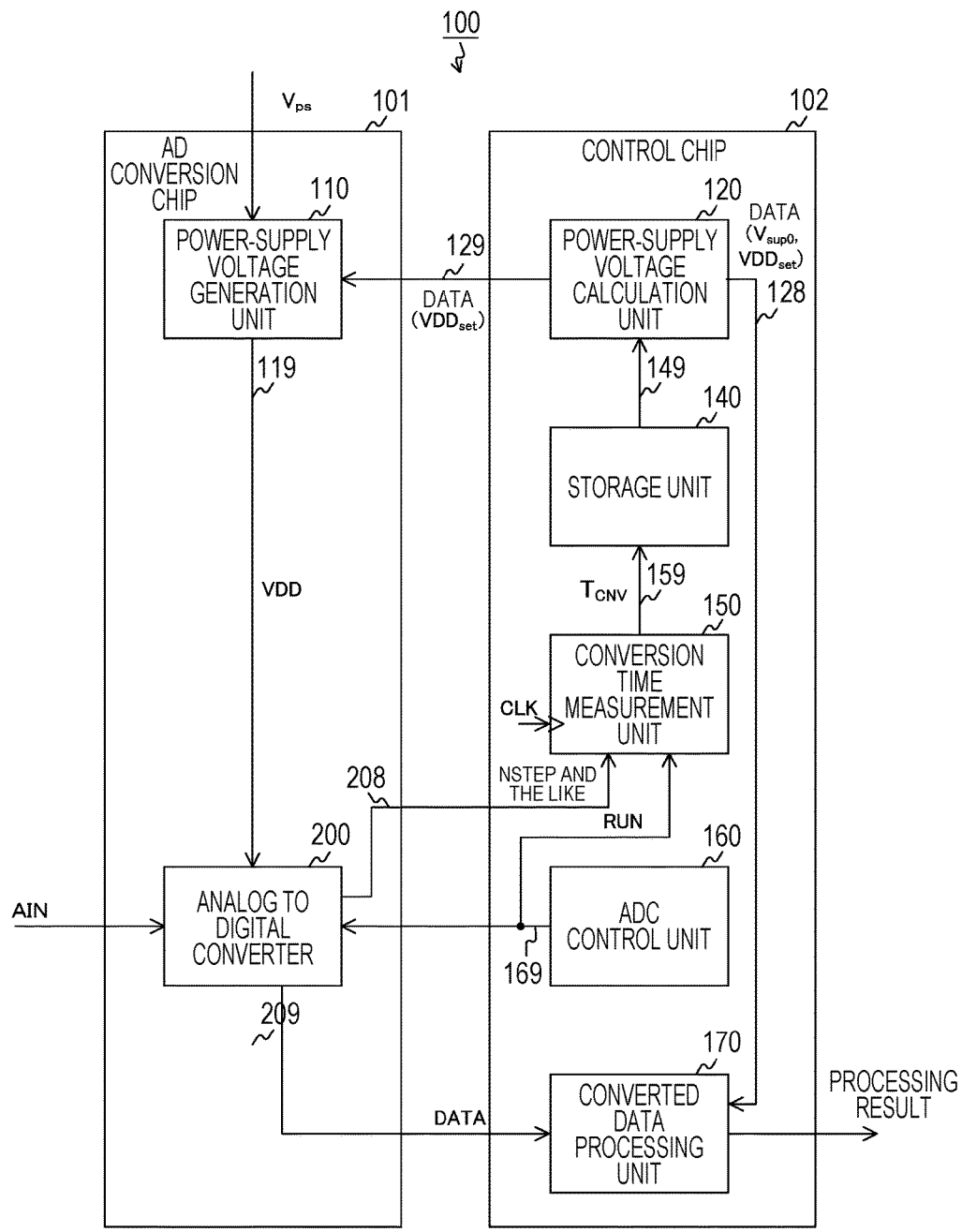
FIG. 26 is a block diagram illustrating a configuration example of an electronic device in a fourth embodiment.

FIG. 26 is a block diagram illustrating a configuration example of the electronic device 100 in the fourth embodiment. The electronic device 100 is provided with an AD conversion chip 101 and a control chip 102. The AD conversion chip 101 is provided with a power-supply voltage generation unit 110 and an analog to digital converter 200. Also, the control chip 102 is provided with a power-supply voltage calculation unit 120, a storage unit 140, a conversion time measurement unit 150, an ADC control unit 160, and a converted data processing unit 170. Also, the AD conversion chip 101 and the control chip 102 are stored in the same casing.

As described above, according to the fourth embodiment of the present technology, since the circuits are dispersedly provided on a plurality of semiconductor chips, it is possible to decrease power consumption in the electronic device 100 provided with a plurality of semiconductor chips.

5. Fifth Embodiment

Although the AD conversion chip 101 and the control chip 102 are stored in the same casing in the fourth embodiment described above, they may also be stored in different casings. An electronic circuit system of a fifth embodiment is different from that of the fourth embodiment in that an AD conversion chip 101 and a control chip 102 are stored in different casings.

Figure 27:
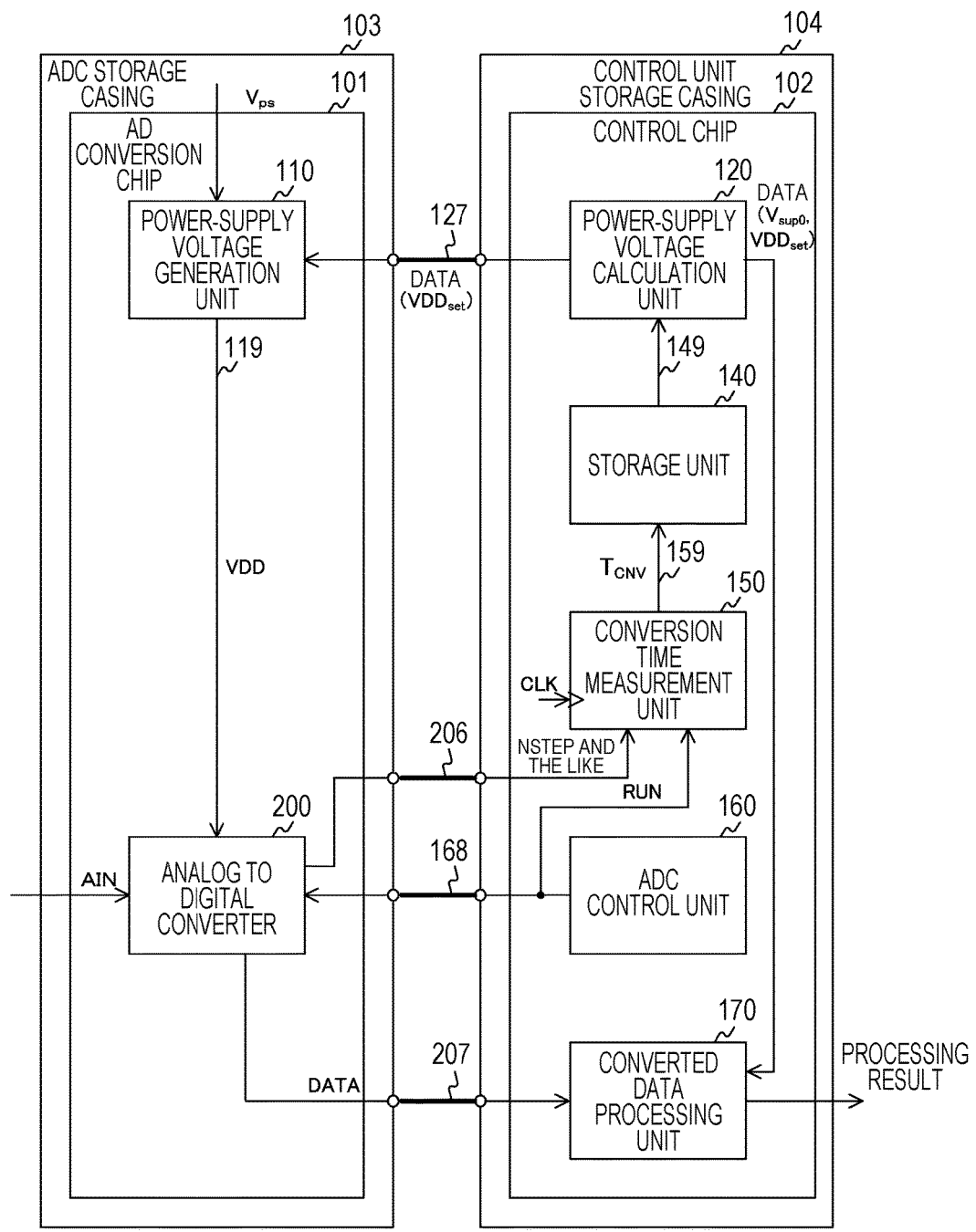
FIG. 27 is a block diagram illustrating a configuration example of an electronic circuit system in a fifth embodiment.

FIG. 27 is a block diagram illustrating a configuration example of the electronic circuit system of the fifth embodiment. The electronic circuit system is provided with an ADC storage casing 103 and a control unit storage casing 104. The AD conversion chip 101 is stored in the ADC storage casing 103, and the control chip 102 is stored in the control unit storage casing 104.

The ADC storage casing 103 and the control unit storage casing 104 are connected to each other by signal lines 127, 168, 206, and 207. A power-supply voltage calculation unit 120 transmits data indicating a power-supply voltage set value $VDD_{set}$ to a power-supply voltage generation unit 110 via the signal line 127, and an analog to digital converter 200 transmits frequency information (NSTEP and the like) to a conversion time measurement unit 150 via the signal line 206. Also, the ADC control unit 160 transmits a start instruction signal RUN to the analog to digital converter 200 via the signal line 168, and the analog to digital converter 200 transmits converted data DATA to a converted data processing unit 170 via the signal line 207.

A power-supply circuit which supplies voltage ($V_{PS}$) to the power-supply voltage generation unit 110 is not illustrated in FIG. 27. This power-supply circuit may be provided in the ADC storage casing 103 or in the control unit storage casing 104.

As described above, according to the fifth embodiment of the present technology, since the AD conversion chip 101 and the control chip 102 are stored in the different casings, power consumption may be reduced in the electronic circuit system provided with a plurality of casings.

6. Sixth Embodiment

Although the analog signal generated outside the ADC storage casing 103 is subjected to the AD conversion by the analog to digital converter 200 in the fifth embodiment described above, it is also possible to perform the AD conversion on the analog signal generated inside the ADC storage casing 103. A power-supply voltage generation unit 110 of a sixth embodiment is different from that of the fifth embodiment in that an analog to digital converter 200 performs AD conversion on an analog signal generated inside an ADC storage casing 103.

Figure 28:
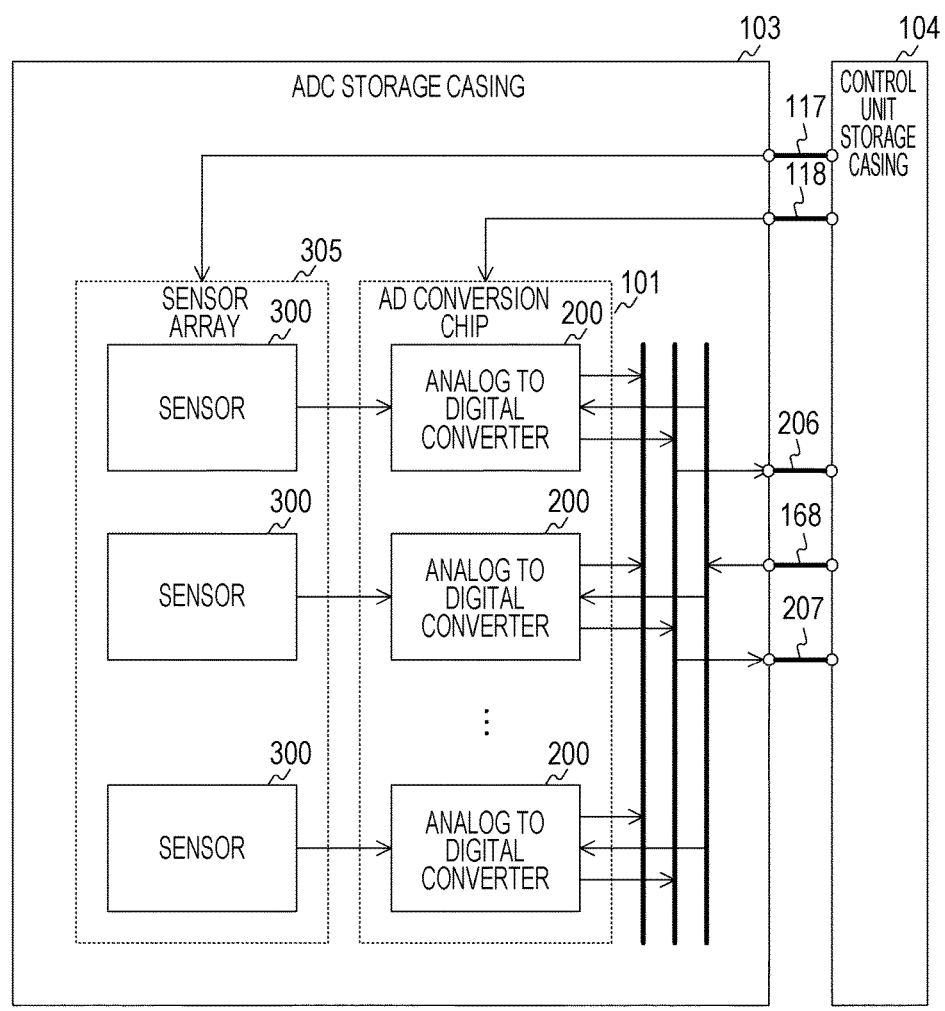
FIG. 28 is a block diagram illustrating a configuration example of an electronic circuit system in a sixth embodiment.

FIG. 28 is a block diagram illustrating a configuration example of an electronic circuit system according to the sixth embodiment. The ADC storage casing 103 of the sixth embodiment is provided with a sensor array 305 and an AD conversion chip 101. The sensor array 305 is provided with M sensors 300. Also, the AD conversion chip 101 is provided with M analog to digital converters 200. The M analog to digital converters 200 are connected to the sensors 300 on one-to-one basis. Meanwhile, the electronic circuit system is provided with M sets of the sensor 300 and the analog to digital converter 200, but may also include only one set.

The sensor 300 measures a predetermined physical amount such as temperature, a light amount, a sound volume and the like. The sensor 300 transmits an analog signal indicating a measured value to a corresponding analog to digital converter 200.

Also, the ADC storage casing 103 and the control unit storage casing 104 are connected to each other by signal lines 117, 118, 168, 206, and 207.

Figure 29:
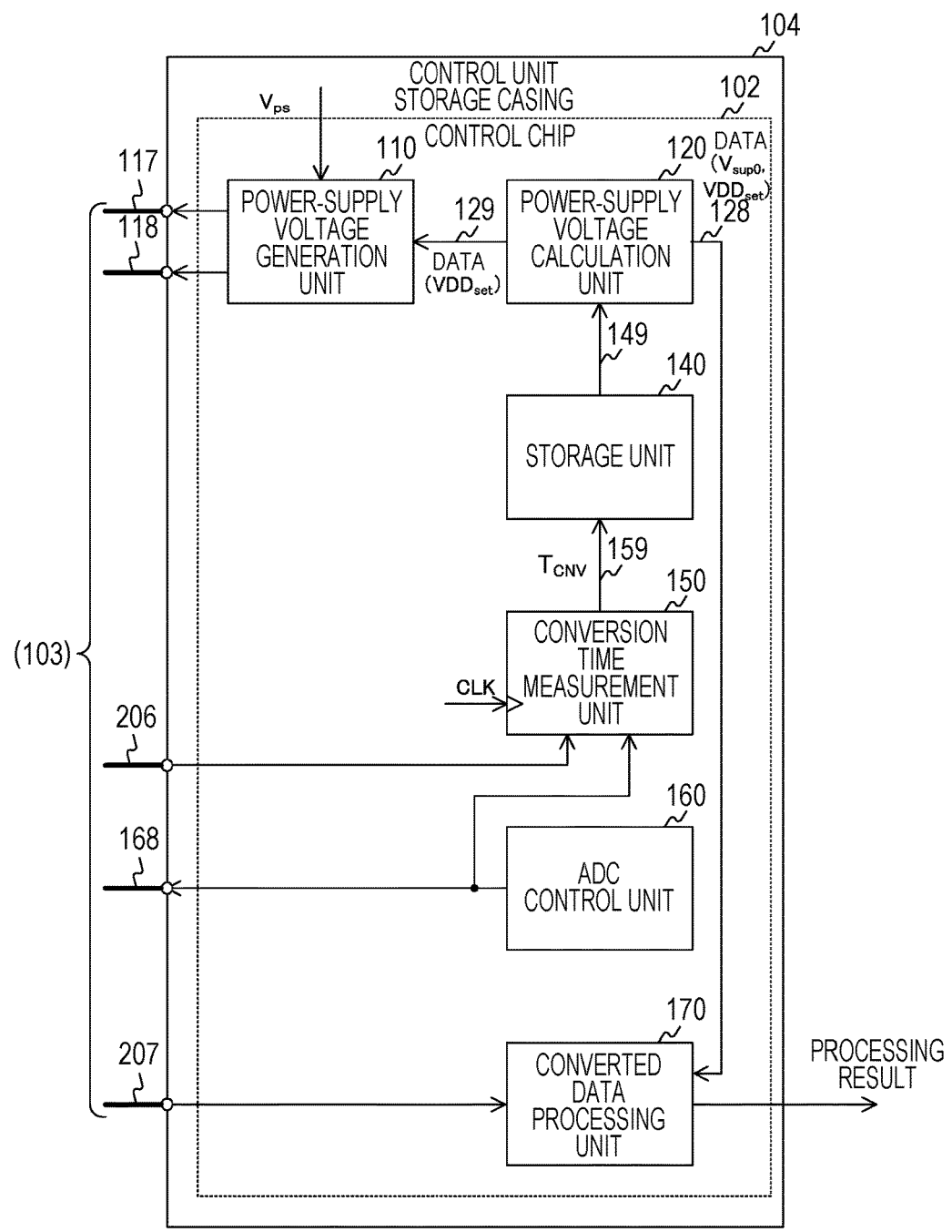
FIG. 29 is a block diagram illustrating a configuration example of a control unit storage casing in the sixth embodiment.

FIG. 29 is a block diagram illustrating a configuration example of a control unit storage casing 104 in the sixth embodiment. The control unit storage casing 104 is provided with a control chip 102. The control chip 102 of the sixth embodiment is different from that of the first embodiment in further including the power-supply voltage generation unit 110. The power-supply voltage generation unit 110 supplies power-supply voltage to the sensor array 305 via the signal line 117 and supplies the power-supply voltage to the AD conversion chip 101 via the signal line 118.

Meanwhile, although the power-supply voltage generation unit 110 is provided in the control unit storage casing 104 in the sixth embodiment, this may also be provided in the ADC storage casing 103 as in the fifth embodiment.

As described above, according to the sixth embodiment of the present technology, since the voltage control unit 110 controls the power-supply voltage of the ADC storage casing 103 which incorporates the sensor 300, power consumption may be decreased in the casing incorporating the sensor 300.

7. Seventh Embodiment

In the sixth embodiment described above, the signals such as the comparison counter value and the converted data are transmitted in parallel form between the ADC storage casing 103 and the control unit storage casing 104. However, as a data amount of the signals increases, the number of signal lines might increase. An electronic circuit system of a seventh embodiment is different from that of the sixth embodiment in that the number of signal lines between casings is reduced.

Figure 30:
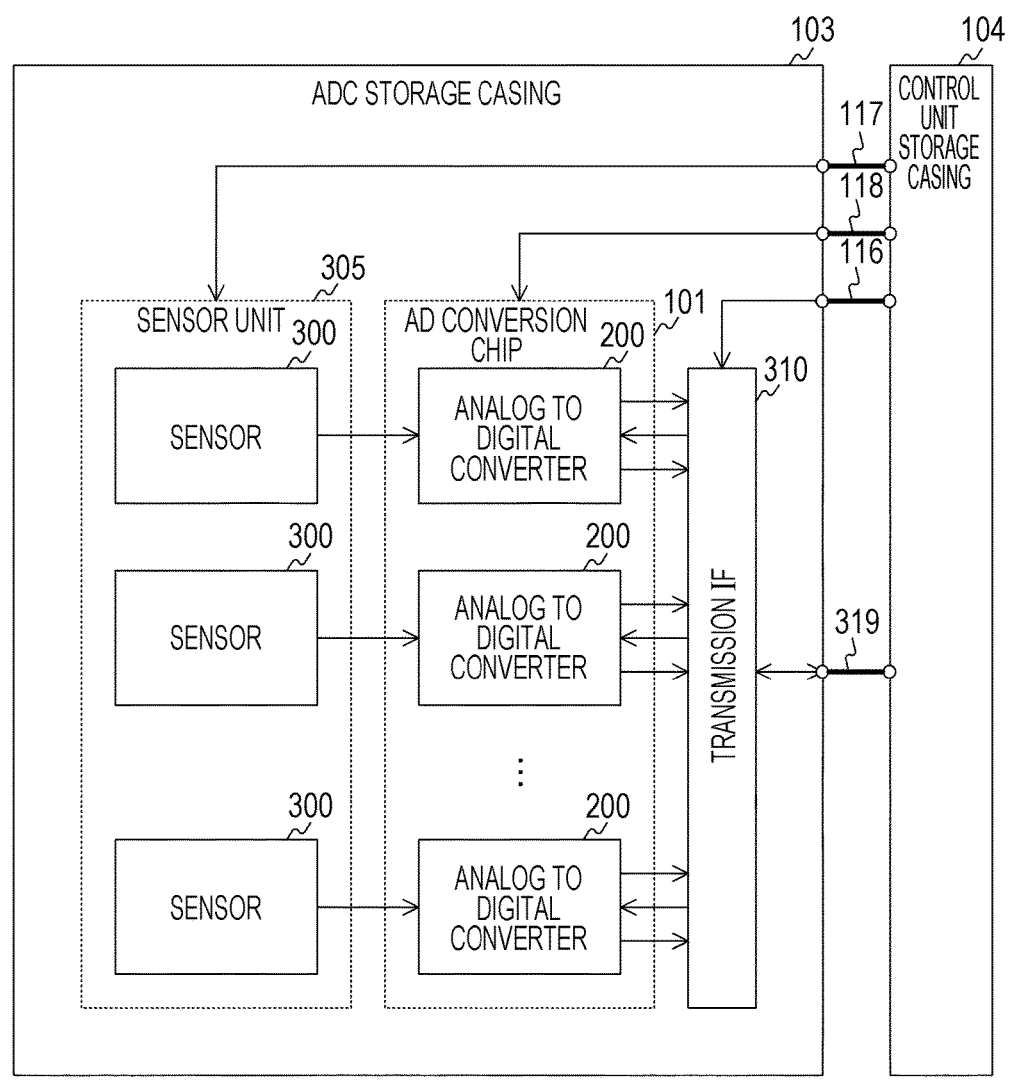
FIG. 30 is a block diagram illustrating a configuration example of an electronic circuit system in a seventh embodiment.

FIG. 30 is a block diagram illustrating a configuration example of the electronic circuit system in the seventh embodiment. The electronic circuit system of the seventh embodiment is different from that of the first embodiment in that a transmission interface 310 is further stored in the ADC storage casing 103.

The transmission interface 310 has a function of converting a parallel signal to a serial signal and a function of converting a serial signal to a parallel signal. The transmission interface 310 receives a parallel signal such as converted data DATA and a comparison counter value NSTEP from an AD conversion chip 101 and converts the parallel signal to a serial signal. Then, the transmission interface 310 transmits the serial signal to a control unit storage casing 104 via the signal line 319. Also, the transmission interface 310 receives a start instruction signal RUN from the control unit storage casing 104 via a signal line 319 and supplies the same to the AD conversion chip 101.

Also, the ADC storage casing 103 and the control unit storage casing 104 are connected to each other by signal lines 116, 117, 118, and 319.

Figure 31:
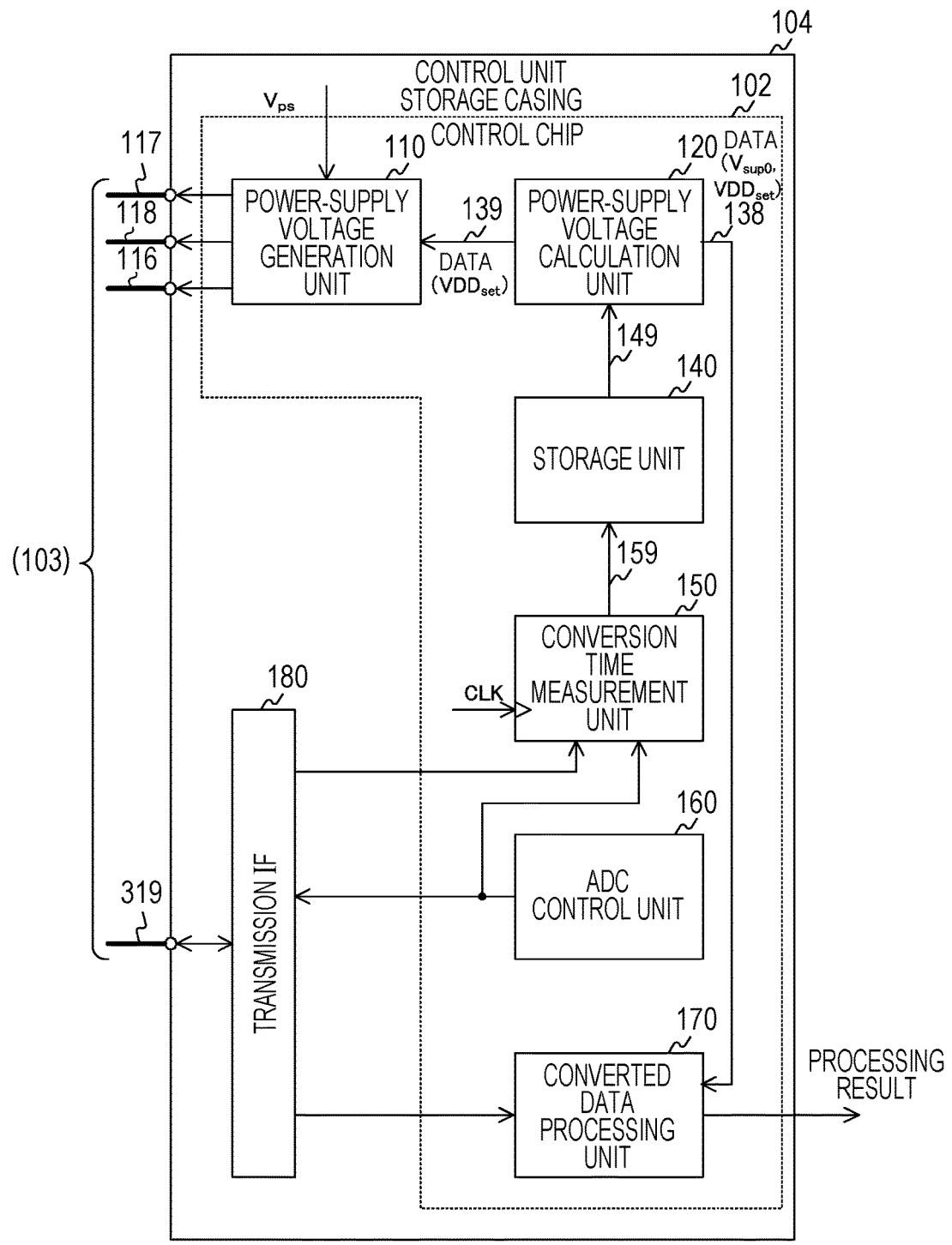
FIG. 31 is a block diagram illustrating a configuration example of a control unit storage casing in the seventh embodiment.

FIG. 31 is a block diagram illustrating a configuration example of the control unit storage casing 104 in the seventh embodiment. The control unit storage casing 104 of the seventh embodiment is provided with a transmission interface 180 and a control chip 102.

The transmission interface 180 has a function of converting a parallel signal to a serial signal and a function of converting a serial signal to a parallel signal. The transmission interface 180 receives a serial signal from the ADC storage casing 103 via the signal line 319, and converts the serial signal to a parallel signal such as the converted data DATA and the comparison counter value NSTEP. The transmission interface 180 supplies the converted data DATA and the like to the control chip 102. Also, the transmission interface 180 receives the start instruction signal RUN from the control chip 102 and transmits the signal to the ADC storage casing 103 through the signal line 319.

Also, the power-supply voltage generation unit 110 of the seventh embodiment supplies the power-supply voltage to the transmission interface 310, a sensor array 305, and the AD conversion chip 101 via the signal lines 116, 117, and 118.

Meanwhile, although the power-supply voltage generation unit 110 is provided in the control unit storage casing 104 in the seventh embodiment, this may also be provided in the ADC storage casing 103 as in the fifth embodiment. In this case, the transmission interface 180 may convert a parallel control signal indicating a voltage control amount to a serial signal and transmit the same to the ADC storage casing 103.

As described above, according to the seventh embodiment of the present technology, since the transmission interface 310 converts the parallel signal to the serial signal and transmits the same to the control unit storage casing 104, the number of signal lines may be reduced as compared with a case in which the parallel signal is transmitted/received between the casings.

8. Eighth Embodiment

In the seventh embodiment described above, the ADC storage casing 103 and the control unit storage casing 104 transmit/receive power and data by wire, but they may also be transmitted in a non-contact manner. An electronic circuit system of an eighth embodiment is different from that of the seventh embodiment in that power and data are transmitted/received between casings in a non-contact manner.

Figure 32:
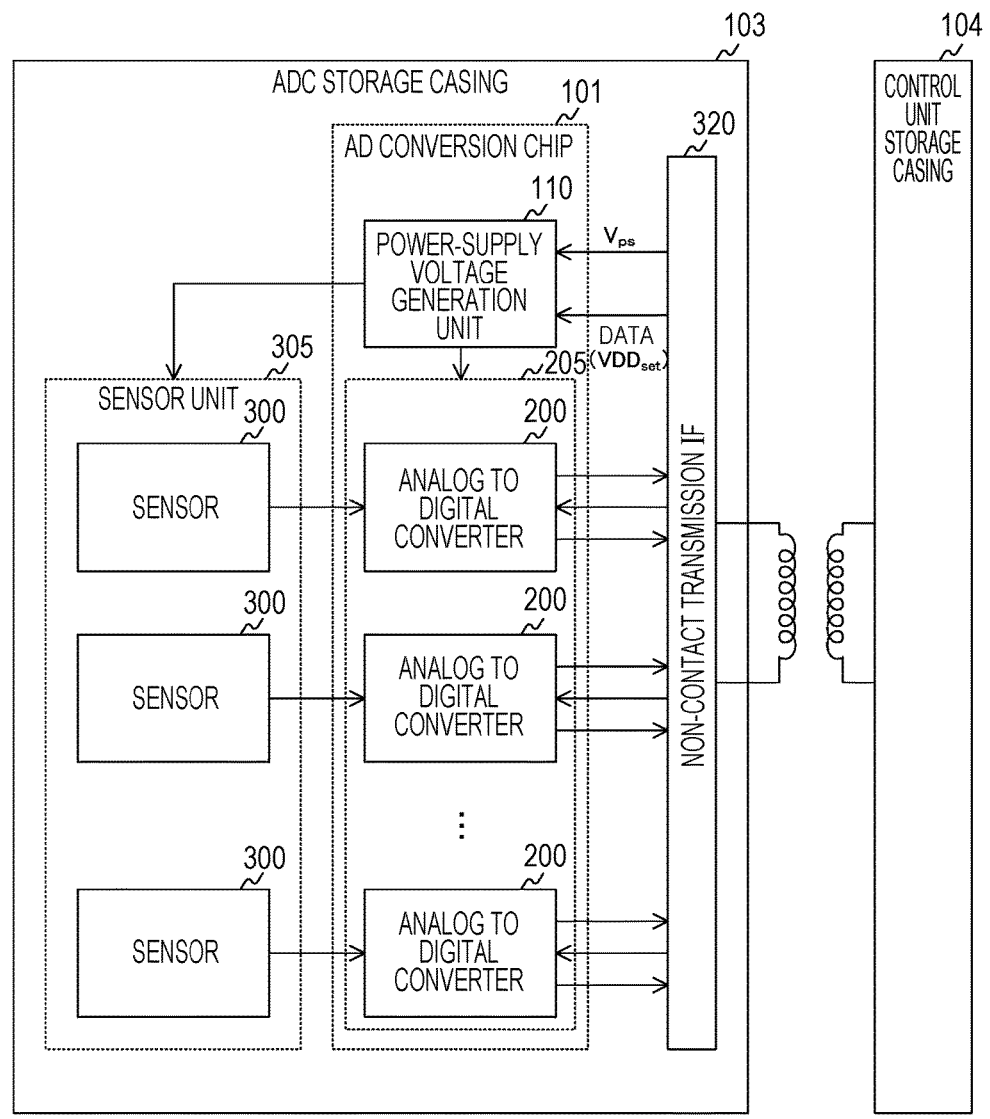
FIG. 32 is a block diagram illustrating a configuration example of an electronic circuit system in an eighth embodiment.

FIG. 32 is a block diagram illustrating a configuration example of the electronic circuit system in the eighth embodiment. An ADC storage casing 103 of the eighth embodiment is different from that of the seventh embodiment in that a non-contact transmission interface 320 is provided in place of a transmission interface 310. Also, an AD conversion chip 101 of the eighth embodiment is provided with a power-supply voltage generation unit 110 and an analog to digital conversion unit 205. The analog to digital conversion unit 205 is provided with M analog to digital converters 200.

The non-contact transmission interface 320 transmits the power and data in a non-contact manner. The non-contact transmission interface 320 receives an alternating-current signal in which a control signal and a start instruction signal RUN are superimposed on a carrier wave from the control unit storage casing 104 in a non-contact manner. Then, the non-contact transmission interface 320 takes out the control signal and the start instruction signal RUN from the alternating-current signal by demodulation and supplies the same to the AD conversion chip 101 together with voltage $V_{sup0}$ corresponding to the received power.

Also, the non-contact transmission interface 320 extracts the carrier wave from the received alternating-current signal and generates an alternating-current signal on the basis of the carrier wave. Then, the non-contact transmission interface 320 superimposes a comparison counter value NSTEP, a timing signal NRDY, and converted data DATA from the AD conversion chip 101 on the generated alternating-current signal and transmits the same to the control unit storage casing 104 in a non-contact manner.

As a system of transmitting the power and data in a non-contact manner in the non-contact transmission interface 320, various systems such as an electromagnetic induction system, an electromagnetic field resonance system, and an electric field coupling system may be used. Also, various standards such as the Qi (registered trademark) standard, the power matters alliance (PMA) standard, the A4WP standard, and the near field communication (NFC) standard may be used in the various transmission systems.

Figure 33:
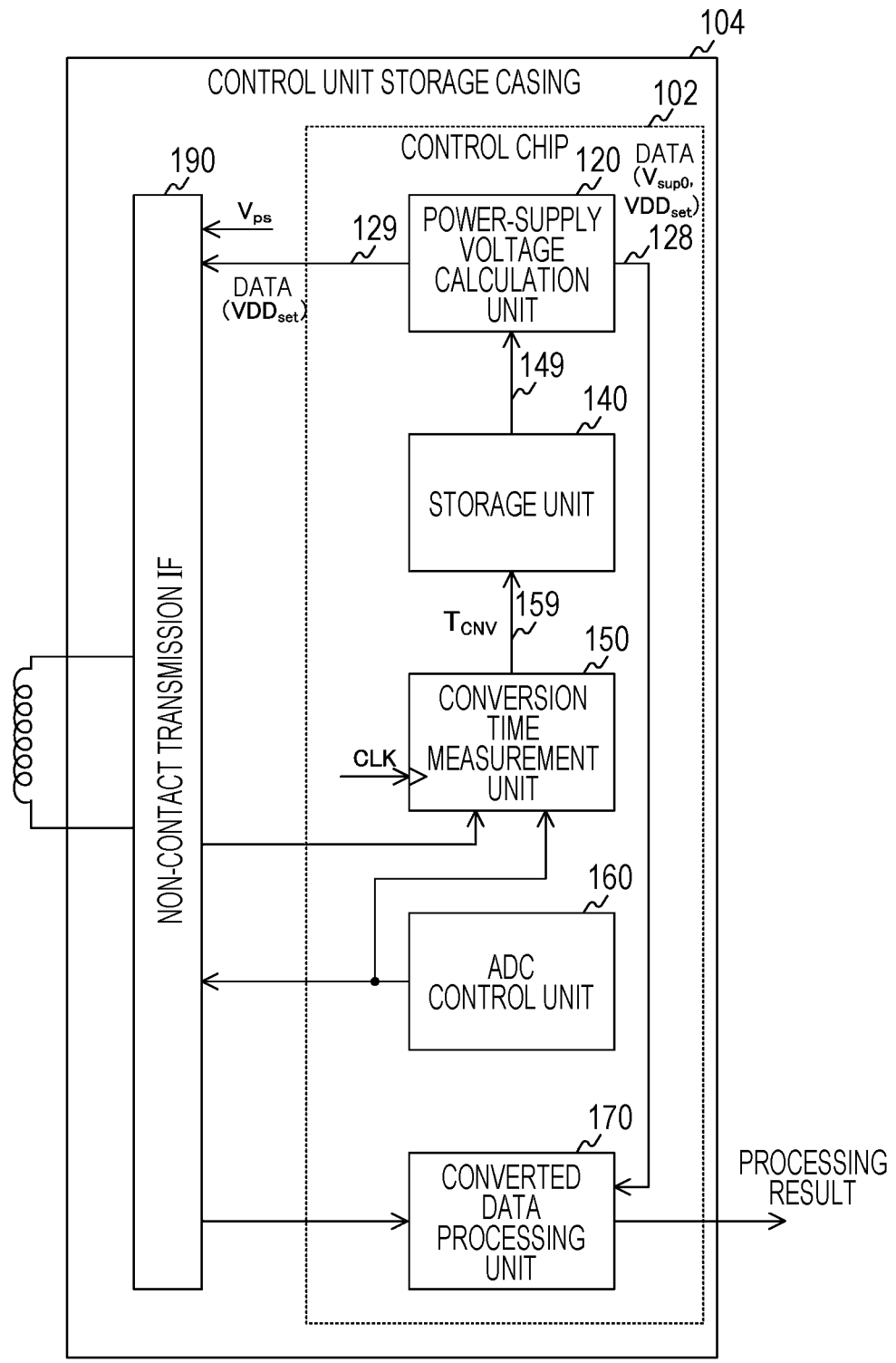
FIG. 33 is a block diagram illustrating a configuration example of a control unit storage casing in the eighth embodiment.

FIG. 33 is a block diagram illustrating a configuration example of a control unit storage casing 104 in the eighth embodiment. The control unit storage casing 104 of the eighth embodiment is different from that of the seventh embodiment in that the power-supply voltage generation unit 110 is not provided and a non-contact transmission interface 190 is provided in place of a transmission interface 180.

The non-contact transmission interface 190 transmits the power and data in a non-contact manner. The non-contact transmission interface 190 transmits the alternating-current signal on which data ($VDD_{set}$) is superimposed to the ADC storage casing 103 in a non-contact manner, receives the alternating-current signal from the ADC storage casing 103 in a non-contact manner, and takes out a comparison counter value NSTEP and the like.

As described above, according to the eighth embodiment of the present technology, the non-contact transmission interface 320 receives the power and data from the control unit storage casing 104 in a non-contact manner, so that it is not necessary to wire the signal line between the casings and it becomes possible to transmit the power and data without the signal line.

Meanwhile, the above-described embodiments describe an example of embodying the present technology, and there is a correspondence relationship between the matters in the embodiments and the matters specifying the invention in claims. Similarly, there is a correspondence relationship between the matters specifying the invention in claims and the matters in the embodiments of the present technology having the same names. However, the present technology is not limited to the embodiments and may be embodied with various modifications of the embodiment without departing from the spirit thereof.

Also, the procedures described in the above-described embodiments may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-ray (registered trademark) Disc and the like may be used, for example, as the recording medium.

Meanwhile, the effects are not necessarily limited to the effects herein described and may be any effect described in the present disclosure.

Meanwhile, the present technology may also have a following configuration.

(1) A system including:
an analog to digital converter which compares an analog signal with a reference signal and outputs frequency information indicating the number of times of comparison; and
a power-supply voltage generation unit which generates power-supply voltage on the basis of the frequency information to supply to the analog to digital converter.

(2) The system according to (1) described above, further including:
a conversion time measurement unit which measures conversion time from when the analog signal is sampled until the number of times of comparison indicated by the frequency information reaches a certain number of times,
in which the power-supply voltage generation unit generates the power-supply voltage according to the measured conversion time, and
the analog to digital converter includes
a comparator which compares the analog signal with the reference signal to generate the comparison result,
a digital signal holding unit which holds the comparison result each time the comparison result is generated and outputs a signal indicating the held value as a digital signal,
a reference signal supply unit which changes a value of the reference signal on the basis of the digital signal to supply to the comparator, and
a frequency information output unit which outputs the frequency information.

(3) The system according to (2) described above,
in which the frequency information output unit outputs the frequency information over a period from when the analog signal is sampled until a predetermined sampling period elapses, and
the conversion time measurement unit obtains the conversion time from the number of times of comparison within the sampling period and the predetermined sampling period in a case where the sampling period elapses before the number of times of comparison reaches the certain number of times.

(4) The system according to (2) or (3) described above,
in which, the longer the conversion time, the higher the power-supply voltage which the power-supply voltage generation unit generates.

(5) The system according to any one of (2) to (4) described above, further including:
a power-supply voltage calculation unit which obtains a difference between the conversion time and predetermined target time and calculates a set value of the power-supply voltage from the difference,
in which the power-supply voltage generation unit generates the power-supply voltage according to the set value.

(6) The system according to (5) described above, further including:

a conversion time holding unit which holds each of the conversion times measured within a predetermined voltage control period,
in which the power-supply voltage calculation unit calculates a statistic amount of the held conversion times each time the predetermined voltage control period elapses and obtains a difference between the statistic amount and the predetermined target time.

(7) The system according to (6) described above,
in which the conversion time holding unit further holds the digital signal in association with each of the conversion times, and
the power-supply voltage calculation unit determines a weight coefficient smaller than the weight coefficient for the digital signal of other than a specific value for the digital signal of the specific value and performs weighting calculation of the conversion times by the weight coefficient.

(8) The system according to any one of (2) to (7) described above,
in which, the power-supply voltage generation unit supplies the power-supply voltage to other than the reference signal supply unit.

(9) The system according to (8) described above, further including:
a converted data processing unit which corrects the converted data on the basis of a value of the power-supply voltage.

(10) The system according to any one of (2) to (9) described above,
in which the power-supply voltage generation unit generates the power-supply voltage of each of a plurality of the analog to digital converters.

(11) The system according to any one of (2) to (10) described above,
in which the analog to digital converter is provided on an analog to digital conversion chip, and
the conversion time measurement unit is provided on a control chip.

(12) The system according to (11) described above,
in which the analog to digital conversion chip is provided in an analog to digital converter storage casing, and
the control chip is provided in a control unit storage casing.

(13) The system according to (12) described above, further including:
a sensor which generates the analog signal; and
a sample hold circuit which samples the generated analog signal to hold,
in which the sample hold circuit is provided on the analog to digital conversion chip,
the analog to digital conversion chip is connected to the sensor, and
the sensor is provided in the analog to digital converter storage casing.

(14) The system according to (12) or (13) described above, further including:
a transmission interface which converts the digital signal to a serial signal to transmit to the control unit storage casing.

(15) The system according to (12) or (13) described above, further including:
a non-contact transmission interface which performs processing of transmitting the digital signal to the control unit storage casing in a non-contact manner and processing of receiving a control signal indicating a control amount of the power-supply voltage from the control unit storage casing in a non-contact manner.

(16) The system according to (15) described above,
in which the non-contact transmission interface receives an alternating-current signal of power according to power consumption of the analog to digital converter storage casing from the control unit storage casing in a non-contact manner to supply to the comparator.

(17) The system according to (16) described above,
in which the non-contact transmission interface receives the alternating-current signal in which the control signal is superimposed on a carrier wave from the control unit storage casing in a non-contact manner and superimposes the digital signal on a new alternating-current signal generated on the basis of the carrier wave to transmit to the control unit storage casing.

(18) The system according to any one of (2) to (17) described above,
in which the power-supply voltage generation unit supplies the power-supply voltage over a supply period from when sampling of the analog signal is instructed until the number of times of comparison reaches a predetermined number of times, and stops supplying the power-supply voltage in a period other than the supply period, and
the certain number of times does not exceed the predetermined number of times.

(19) An analog to digital converter including:
a comparator which compares an analog signal with a reference signal to generate a comparison result;
a digital signal holding unit which holds the comparison result each time the comparison result is generated and outputs a digital signal including the comparison result;
a reference signal supply unit which changes a value of the reference signal on the basis of the digital signal to supply to the comparator; and
a frequency information output unit which outputs frequency information indicating the number of times of comparison of the analog signal as the number of times of comparison.

(20) A method of controlling a system including:
an analog to digital conversion procedure of comparing an analog signal with a reference signal and outputting frequency information indicating the number of times of comparison; and
a power-supply voltage generation procedure of generating power-supply voltage on the basis of the frequency information to supply to the analog to digital converter.

REFERENCE SIGNS LIST

100 Electronic device
101 AD conversion chip
102 Control chip
103 ADC storage casing
104 Control unit storage casing
110, 111 Power-supply voltage generation unit
120, 130 Power-supply voltage calculation unit
131 Voltage setting unit
132 Weighted average calculation unit
133 Weight coefficient determination unit
140, 141 Storage unit
150 Conversion time measurement unit
160 ADC control unit
170 Converted data processing unit
180, 310 Transmission interface
190, 320 Non-contact transmission interface
200 Analog to digital converter
205 Analog to digital conversion unit
210 Sample/hold circuit
220 Comparator
221 to 229 Transistor
230 Latch circuit
240 Voltage generation unit
250 Resister
260 DA converter
270 XOR (exclusive OR) gate
280 State machine
281 Counter
282 Sequencer
283 NOT gate
284 Conversion end signal generation unit
300 Sensor
305 Sensor array

The invention claimed is:

1. A system, comprising:
an analog to digital converter configured to:
compare an analog signal with a reference signal a plurality of times;
determine a count value based on the comparison of the analog signal with the reference signal, wherein the count value indicates a number of the plurality of times of the comparison of the analog signal with the reference signal; and
output frequency information that includes the count value;
a power-supply voltage calculation circuit configured to:
obtain a difference between a conversion time and a specific target time, wherein the conversion time is based on the count value; and
determine a set value of a power-supply voltage based on the difference; and
a power-supply voltage generation circuit configured to:
generate the power-supply voltage based on the set value; and
supply the power-supply voltage to the analog to digital converter.

2. The system according to claim 1, further comprising:
a conversion time measurement circuit configured to measure the conversion time from initialization of a sampling process of the analog signal until the number of the plurality of times of the comparison reaches a determined number of times, and
wherein the analog to digital converter includes:
a comparator configured to:
compare the analog signal with the reference signal; and
generate a comparison result based on the comparison of the analog signal with the reference signal,
a digital signal holding circuit configured to:
store the comparison result each time the comparison result is generated; and
output a signal indicating the stored comparison result as a digital signal, a reference signal supply circuit configured to:
change a value of the reference signal based on the digital signal; and
supply the reference signal to the comparator based on the change of the value of the reference signal; and
a frequency information output circuit configured to output the frequency information.

3. The system according to claim 2, wherein
the frequency information output circuit is further configured to output the frequency information over a time period from the initialization of the sampling process of the analog signal until a specific sampling period elapses, and the conversion time measurement circuit is further configured to obtain the conversion time based on the number of the plurality of times of the comparison within one of a sampling period or the specific sampling period, wherein the conversion time is obtained from the specific sampling period based on elapse of the sampling period before the number of the plurality of times of the comparison reaches the determined number of times.

4. The system according to claim 2, wherein, an increase in the conversion time increases the power-supply voltage generated by the power-supply voltage generation circuit.

5. The system according to claim 2, further comprising:
a conversion time holding circuit configured to hold each of a plurality of conversion times measured within a determined voltage control period,
wherein the power-supply voltage calculation circuit is further configured to:
calculate a statistic amount of each of the plurality of conversion times each time the determined voltage control period elapses; and
obtain a difference between the statistic amount and the specific target time.

6. The system according to claim 5,
wherein the conversion time holding circuit is further configured to hold the digital signal in association with each of the plurality of conversion times, and
the power-supply voltage calculation circuit is further configured to:
determine a first weight coefficient that is smaller than a second weight coefficient for the digital signal, wherein the second weight coefficient corresponds to a specific value associated with erroneous operation of the system; and
calculate a weight of each of the plurality of conversion times based on the first weight coefficient.

7. The system according to claim 2, wherein the analog to digital converter further includes a plurality of circuits configured to convert the analog signal to the digital signal, wherein the plurality of circuits includes the reference signal supply circuit, and wherein the power-supply voltage generation circuit is further configured to supply the power-supply voltage to one of the plurality of circuits other than the reference signal supply circuit.

8. The system according to claim 7, wherein
the analog to digital converter is further configured to generate converted data based on a conversion of the analog signal, and
the system further comprising a converted data processing circuit configured to correct the converted data based on a value of the power-supply voltage.

9. The system according to claim 2, wherein the power-supply voltage generation circuit is further configured to generate the power-supply voltage of each of a plurality of analog to digital converters.

10. The system according to claim 2, further comprising:
an analog to digital conversion chip comprising the analog to digital converter; and
a control chip comprising the conversion time measurement circuit.

11. The system according to claim 10, further comprising:
an analog to digital converter storage casing that includes the analog to digital conversion chip; and
a control unit storage casing that includes the control chip.

12. The system according to claim 11, further comprising:
a sensor configured to generate the analog signal; and
a sample hold circuit configured to:
sample the analog signal; and
hold the sampled analog signal,
wherein
the sample hold circuit is on the analog to digital conversion chip,
the analog to digital conversion chip is connected to the sensor, and
the sensor is in the analog to digital converter storage casing.

13. The system according to claim 11, further comprising a transmission interface configured to:
convert the digital signal to a serial signal; and
transmit the serial signal to the control unit storage casing.

14. The system according to claim 11, further comprising:
a non-contact transmission interface configured to:
transmit the digital signal wirelessly to the control unit storage casing in a non-contact manner; and
receive, wirelessly from the control unit storage casing in the non-contact manner, a control signal indicating a control amount of the power-supply voltage.

15. The system according to claim 14, wherein the non-contact transmission interface is further configured to:
receive, wirelessly from the control unit storage casing, an alternating-current signal based on power consumption of the analog to digital converter storage casing; and
supply the alternating-current signal to the comparator.

16. The system according to claim 15,
wherein the non-contact transmission interface is further configured to:
receive, wirelessly from the control unit storage casing, the alternating-current signal in which the control signal is superimposed on a carrier wave;
superimpose the digital signal on a new alternating-current signal, wherein the new alternating-current signal is generated based on the carrier wave; and
transmit the digital signal that is superimposed on the new alternating-current signal to the control unit storage casing.

17. The system according to claim 2,
wherein the power-supply voltage generation circuit is further configured to:
supply the power-supply voltage over a supply period, wherein the supply period is from initialization of the sampling process of the analog signal until the number of the plurality of times of the comparison reaches a threshold number of times; and
stop the supply of the power-supply voltage in a period other than the supply period, and
wherein the determined number of times is one of less than or equal to the threshold number of times.

18. An analog to digital converter, comprising:
a comparator configured to:
compare an analog signal with a reference signal a plurality of times; and
generate a comparison result for each comparison of the analog signal with the reference signal;
a digital signal holding circuit configured to:
hold the comparison result each time the comparison result is generated; and
output a digital signal including the comparison result;
a reference signal supply circuit configured to:
change a value of the reference signal based on the digital signal; and
supply the reference signal to the comparator based on the change of the value of the reference signal; and a frequency information output circuit configured to:
  determine a count value based on the comparison of the analog signal with the reference signal, wherein the count value indicates a number of the plurality of times of the comparison of the analog signal with the reference signal; and
  output frequency information that includes the count value, wherein
  a set value of a power-supply voltage for the analog to digital converter is determined based on a difference between a conversion time and a specific target time, wherein the conversion time is based on the count value, and
  the power-supply voltage is generated based on the set value.

19. A method, comprising:
comparing, by an analog to digital converter, an analog signal with a reference signal a plurality of times;
determining, by the analog to digital converter, a count value based on the comparison of the analog signal with the reference signal, wherein the count value indicates a number of the plurality of times of the comparison of the analog signal with the reference signal;
outputting frequency information by the analog to digital converter, wherein the frequency information includes the count value;
obtaining, by a power-supply voltage calculation circuit, a difference between a conversion time and a specific target time, wherein the conversion time is based on the count value;
determining, by the power-supply voltage calculation circuit, a set value of a power-supply voltage based on the difference;
generating, by a power-supply voltage generation circuit, the power-supply voltage based on the set value; and
supplying, by the power-supply voltage generation circuit, the power-supply voltage to the analog to digital converter.

* * * * *